(12) United States Patent
Fujii et al.

(10) Patent No.: US 10,083,918 B2
(45) Date of Patent: Sep. 25, 2018

(54) MANUFACTURING METHOD OF SEMICONDUCTOR DEVICE

(71) Applicant: TOYODA GOSEI CO., LTD., Kiyosu-shi (JP)

(72) Inventors: Takahiro Fujii, Kiyosu (JP); Masayoshi Kosaki, Kiyosu (JP); Takaki Niwa, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/697,261

(22) Filed: Sep. 6, 2017

(65) Prior Publication Data

US 2018/0090452 A1    Mar. 29, 2018

(30) Foreign Application Priority Data

Sep. 28, 2016 (JP) ................. 2016-189179

(51) Int. Cl.

| H01L 23/00 | (2006.01) |
|---|---|
| H01L 21/265 | (2006.01) |
| H01L 21/266 | (2006.01) |
| H01L 21/324 | (2006.01) |
| H01L 29/20 | (2006.01) |
| H01L 29/267 | (2006.01) |
| H01L 29/423 | (2006.01) |
| H01L 29/66 | (2006.01) |

(Continued)

(52) U.S. Cl.
CPC ........ *H01L 23/562* (2013.01); *H01L 21/0254* (2013.01); *H01L 21/266* (2013.01); *H01L 21/26546* (2013.01); *H01L 21/3245* (2013.01); *H01L 29/2003* (2013.01); *H01L 29/267* (2013.01); *H01L 29/4236* (2013.01); *H01L 29/66522* (2013.01); *H01L 29/66666* (2013.01); *H01L 21/0228* (2013.01); *H01L 21/0262* (2013.01); *H01L 21/02178* (2013.01); *H01L 21/02189* (2013.01); *H01L 29/42376* (2013.01); *H01L 29/452* (2013.01)

(58) Field of Classification Search
CPC .................................................... H01L 23/562
See application file for complete search history.

(56) References Cited

U.S. PATENT DOCUMENTS

| 5,656,832 A | 8/1997 | Ohba et al. |
| 7,304,331 B2 | 12/2007 | Saito et al. |
| 2016/0093510 A1 | 3/2016 | Agraffeil |

FOREIGN PATENT DOCUMENTS

| JP | 3244980 B2 | 1/2002 |
| JP | 2006-032552 A | 2/2006 |
| JP | 2016-072629 A | 5/2016 |

*Primary Examiner* — Marvin Payen
(74) *Attorney, Agent, or Firm* — McGinn IP Law Group, PLLC.

(57) ABSTRACT

There is provided a manufacturing method of a semiconductor device. The manufacturing method of the semiconductor device comprises: forming at least part of a cap layer that is mainly composed of a nitride, on a semiconductor layer that is mainly composed of a group III nitride semiconductor; implanting a p-type impurity into the semiconductor layer with at least part of the cap layer formed thereon, by ion implantation; forming a block layer having a larger coefficient of thermal expansion than a coefficient of thermal expansion of the cap layer, as a surface layer on the cap layer; and heating the semiconductor layer with the block layer as the surface layer, to activate the p-type impurity.

11 Claims, 27 Drawing Sheets

(51) Int. Cl.
*H01L 21/02* (2006.01)
*H01L 29/45* (2006.01)

MANUFACTURING METHOD OF SEMICONDUCTOR DEVICE

CROSS-REFERENCE TO RELATED APPLICATION

The present application claims priority from Japanese patent application 2016-189179 filed on Sep. 28, 2016, the entirety of the content of which is hereby incorporated by reference into this application.

BACKGROUND

Technical Field

The disclosure relates to a manufacturing method of a semiconductor device.

Related Art

A proposed configuration includes a cap/block that is an AlGaN layer formed on a GaN-based semiconductor material layer of substrate and further includes a coating layer that is composed of, an amorphous silicon, a silicon oxide or a silicon nitride and is formed on the cap/block (as described in JP 2016-72629A).

In this proposed configuration, the coefficient of thermal expansion of the cap/block is a value between the coefficient of thermal expansion of the substrate and the coefficient of thermal expansion of the coating layer. The cap/block accordingly serves as a buffer between the substrate and the coating layer with respect to thermal expansion during heat treatment performed after ion implantation.

When the cap/block and the coating layer described above are provided on a GaN substrate having the size of over 1 inch, however, cracking is likely to occur in the cap/block or in the coating layer, due to a difference between the coefficient of thermal expansion of the GaN substrate and the coefficient of thermal expansion of the coating layer or more specifically due to a difference between their amounts of thermal expansion. As a result, the surface of the GaN substrate in the cracked region is likely not to be protected but to be damaged during the heat treatment.

In order to solve at least part of the problems described above, the disclosure may be implemented by aspects or configurations described below.

SUMMARY

According to one aspect of the disclosure, there is provided a manufacturing method of a semiconductor device. The manufacturing method of a semiconductor device comprises: forming at least part of a cap layer that is mainly composed of a nitride, on a semiconductor layer that is mainly composed of a group III nitride semiconductor; implanting a p-type impurity into the semiconductor layer with at least part of the cap layer formed thereon, by ion implantation; forming a block layer having a larger coefficient of thermal expansion than a coefficient of thermal expansion of the cap layer, as a surface layer on the cap layer; and heating the semiconductor layer with the block layer as the surface layer, activate the p-type impurity.

DESCRIPTION OF EMBODIMENTS

A. First Embodiment

A1. Configuration of Semiconductor Device

Figure 1:
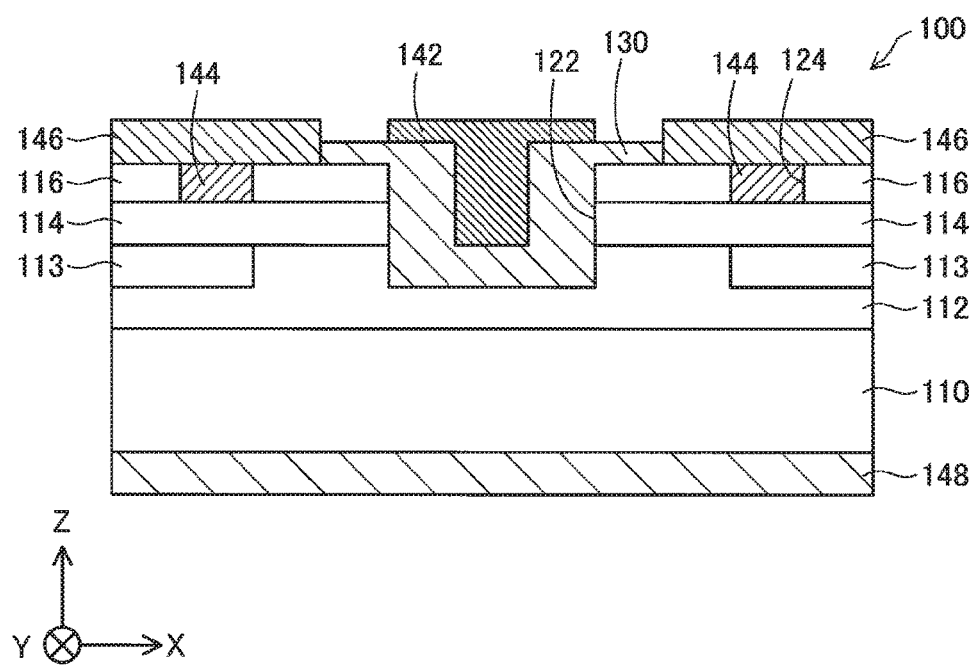
FIG. 1 is a sectional view schematically illustrating the configuration of a semiconductor device according to a first embodiment.

FIG. 1 is a sectional view schematically illustrating the configuration of a semiconductor device 100 according to a first embodiment. For ease of technical understanding, the respective components of the semiconductor device 100 shown in FIG. 1 are illustrated in different scales from the actual scales of these components. In other words, the dimensions of the respective components of the semiconductor device 100 shown in FIG. 1 do not reflect the actual dimensions. The same applies to FIGS. 3 to 15 and FIGS. 17 to 27.

An X axis, a Y axis and a Z axis that are orthogonal to one another are illustrated in FIG. 1. The X axis is an axis extended from left to right in FIG. 1. The Y axis is an axis extended from front to back of the sheet surface in FIG. 1. The Z axis is an axis extended from bottom to top in FIG. 1. XYZ axes in other drawings correspond to the XYZ axes in FIG. 1. In the description hereof, a positive (+) direction of the Z axis may be called "upper" or "upward" for the purpose of convenience. The expression of "upper" or "upward" is, however, not intended to limit the arrangement (direction) of the semiconductor device 100. In other words, the semiconductor device 100 may be arranged in any direction.

The semiconductor device 100 is a GaN-based semiconductor device made by mainly using gallium nitride (GaN). The semiconductor device 100 is a vertical MOSFET (metal-oxide semiconductor field-effect transistor). The semiconductor device 100 is used for power control and is also called power device.

The semiconductor device 100 is configured to include a substrate 110, an n-type semiconductor layer 112, p-type semiconductor regions 113, a p-type semiconductor layer 114 and an n-type semiconductor layer 116. In the description hereof, the term "layer" is not limited to an integrally formed plate-like region. A plurality of portions that are arranged in an approximately identical range in the Z-axis direction and include identical components but are away from one another in the X-axis direction or in the Y-axis direction are also collectively called "layer".

The semiconductor device 100 includes a trench 122 and recesses 124. The semiconductor device 100 further includes an insulating film 130, a gate electrode 142, body electrodes 144, source electrodes 146 and a drain electrode 148.

The substrate 110 is a plate-like semiconductor extended along the X axis and the Y axis. The substrate 110 has a thickness of approximately 300 μm (micrometer). The "thickness" of each layer means the length of each layer measured along the Z-axis direction. A group III nitride semiconductor which the substrate 110 is composed of is preferably a Ga-containing nitride semiconductor, and concrete examples include AlGaN, InGaN and AlInGaN, as well as GaN. According to this embodiment, the substrate 110 is primarily composed of GaN. In the description hereof, the expression of "primarily composed (made) of X", "mainly composed (made) of X" or "composed (made) mainly of X" means containing X at 90% or higher molar fraction. The substrate 110 is an n-type semiconductor containing silicon (Si) as the donor element. The average value of silicon (Si) concentration contained in the substrate 110 is approximately $5\times10^{18}$ cm$^{-3}$.

The n-type semiconductor layer 112, the p-type semiconductor regions 113, the p-type semiconductor layer 114 and the n-type semiconductor layer 116 are composed of a group III nitride semiconductor. More specifically, the n-type semiconductor layer 112, the p-type semiconductor regions 113, the p-type semiconductor layer 114 and the n-type semiconductor layer 116 are composed mainly of gallium nitride (GaN).

The n-type semiconductor layer 112 is a layer located on a positive (+) side in the Z-axis direction of the substrate 110 and extended along the X axis and the Y axis. The n-type semiconductor layer 112 has a thickness of approximately 15 μm. The n-type semiconductor layer 112 is composed of an n-type semiconductor containing silicon (Si) as the donor element. The average value of silicon (Si) concentration contained in the n-type semiconductor layer 112 is approximately $1\times10^{16}$ cm$^{-3}$.

The p-type semiconductor regions 113 are regions formed by ion implantation of a p-type impurity into partial regions of the n-type semiconductor layer 112. The p-type semiconductor region 113 occupies a portion from the surface of the n-type semiconductor layer 112 to a depth in the n-type semiconductor layer 112. In the description hereof, a positive (+)-side face in the Z-axis direction of a certain layer is called "surface" of the certain layer. The p-type semiconductor region 113 has a depth of approximately 1.0 μm from the surface of the n-type semiconductor layer 112. The p-type semiconductor regions 113 are formed at positions away from the trench 122 that is formed to reach part of the n-type semiconductor layer 112 in the semiconductor device 100, with respect to both the X-axis direction and the Y-axis direction. The p-type impurity (acceptor) contained in the p-type semiconductor regions 113 is magnesium (Mg). The average value of magnesium (Mg) concentration contained in the p-type semiconductor regions 113 is approximately $5\times10^{19}$ cm$^{-3}$.

The p-type semiconductor layer 114 is a layer located on a positive (+)-side in the Z-axis direction of the n-type semiconductor layer 112 and the p-type semiconductor regions 113 and extended along the X axis and the Y axis. The p-type semiconductor layer 114 has a thickness of approximately 0.5 μm. The p-type semiconductor layer 114 is composed of a p-type semiconductor containing magnesium (Mg) as the acceptor element. The average value of magnesium (Mg) concentration contained in the p-type semiconductor layer 114 is approximately $1.0\times10^{18}$ cm$^{-3}$.

The n-type semiconductor layer 116 is a layer located on part of a positive (+)-side in the Z-axis direction of the p-type semiconductor layer 114 and extended along the X axis and the Y axis. The n-type semiconductor layer 116 has a thickness of approximately 0.2 μm. The n-type semiconductor layer 116 is composed of an n-type semiconductor containing silicon (Si) as the donor element. The average value of silicon (Si) concentration contained in the n-type semiconductor layer 116 is approximately $5.0\times10^{18}$ cm$^{-3}$.

The trench 122 is a groove that is recessed in the Z-axis direction from the surface of the n-type semiconductor layer 116 to pass through the p-type semiconductor layer 114 and reach the n-type semiconductor layer 112. The trench 122 is formed in part of the n-type semiconductor layer 116, the p-type semiconductor layer 114 and the n-type semiconductor layer 112, with respect to the X-axis direction and the Y-axis direction. The trench 122 is provided in a different region from the regions where the p-type semiconductor regions 113 are formed.

The recesses 124 are concaves that are recessed in the Z-axis direction from the surface of the n-type semiconductor layer 116 to pass through the n-type semiconductor layer 116 and reach the surface of the p-type semiconductor layer 114. The recesses 124 are formed in parts of the n-type semiconductor layer 116, with respect to the X-axis direction and the Y-axis direction. The recesses 124 are provided in different regions from the region where the trench 122 is provided, with respect to both the X-axis direction and the Y-axis direction. The recesses 124 are also provided in regions that overlap with the regions where the p-type semiconductor regions 113 are provided.

The insulating film 130 is continuously formed on an inner face of the trench 122 and on part of the surface of the n-type semiconductor layer 116 forming an outer periphery of the trench 122. The insulating film 130 is a film having electrical insulating property. More specifically, the insulating film 130 is mainly composed of silicon dioxide ($SiO_2$).

The gate electrode 142 is formed inside of the trench 122 that is covered with the insulating film 130, and on the insulating film 130 that is formed on the n-type semiconductor layer 116 forming the outer periphery of the trench 122. The gate electrode 142 is mainly made of aluminum (Al).

The body electrode 144 is formed in the recess 124. The body electrode 144 is mainly made of palladium (Pd). The body electrode 144 forms an ohmic contact with the p-type semiconductor layer 114. The "ohmic contact" herein denotes a contact that has an approximately constant resistant value irrespective of the magnitude of the applied voltage, unlike a Schottky contact.

The source electrode 146 is continuously provided on the body electrode 144 and on the n-type semiconductor layer 116 in part of the circumference of the body electrode 144. The source electrode 146 includes a layer mainly made of titanium (Ti) and a layer mainly made of aluminum (Al), which are arranged sequentially from the body electrode 144- and the n-type semiconductor layer 116-side. The source electrode 146 forms an ohmic contact with the n-type semiconductor layer 116.

The drain electrode 148 is formed on a rear face of the substrate 110. In the description hereof, a negative (−)-side face in the Z-axis direction of a certain layer is called "rear face" of the certain layer. The drain electrode 148 includes a layer mainly made of titanium (Ti) and a layer mainly made of aluminum (Al), which are arranged sequentially from the substrate 110-side. The drain electrode 148 forms an ohmic contact with the substrate 110.

In the semiconductor device 100, when a voltage is applied to the gate electrode 142, an inversion layer is formed in the p-type semiconductor layer 114 at a position near to the insulating film 130 inside of the trench 122. This inversion layer serves as a channel such as to establish electrical continuity between the n-type semiconductor layer 112 and the n-type semiconductor layer 116. This results in forming a conductive pathway from the source electrode 146 to the drain electrode 148.

A2. Manufacturing Method of Semiconductor Device

Figure 2:
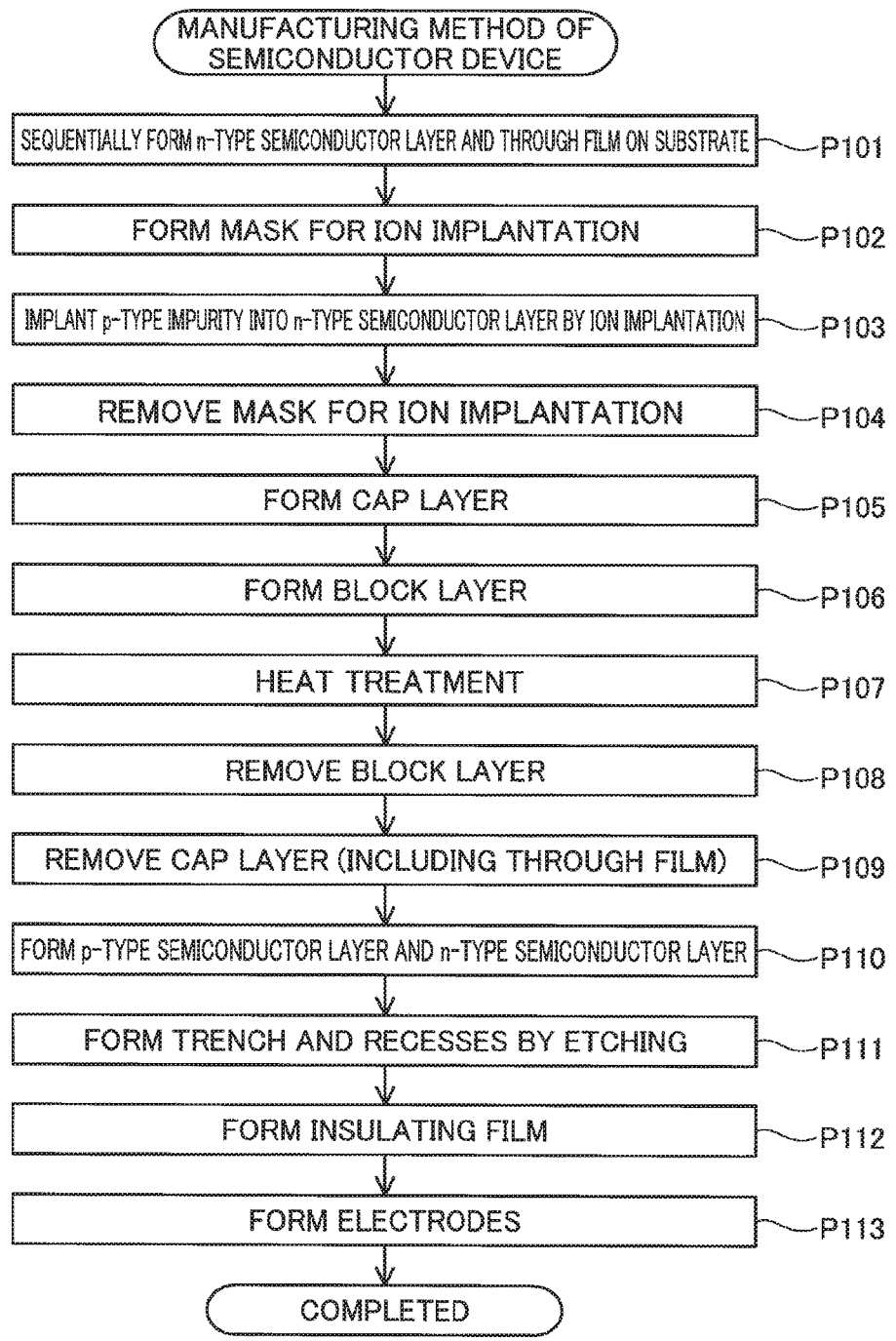
FIG. 2 is a flowchart showing a manufacturing method of the semiconductor device according to the first embodiment.

FIG. 2 is a flowchart showing a manufacturing method of the semiconductor device 100 according to the first embodiment. The following describes the manufacturing method of the semiconductor device 100 according to the first embodiment.

At process P101, the manufacturer first provides the substrate 110. The substrate 110 is an n-type semiconductor that is mainly composed of gallium nitride (GaN) and contains silicon (Si) as the donor element. The manufacturer then sequentially forms the n-type semiconductor layer 112 and a through film Mt11 in this order on the substrate 110. The n-type semiconductor layer 112 and the through film Mt11 are formed by metal organic chemical vapor deposition (MOCVD).

In the description hereof, "sequentially" forming two films or "sequentially" performing formation of two films means that two films are formed without formation of any other layer in between and that a first film is formed on an object in a process chamber and a second film is formed in the same process chamber without discharge of the object from the process chamber.

This process forms the through film Mt11 on the n-type semiconductor layer 112 without the presence of O and Si in the atmosphere. This configuration prevents an impurity such as O and Si from being present between the n-type semiconductor layer 112 and the through film Mt11.

Figure 3:
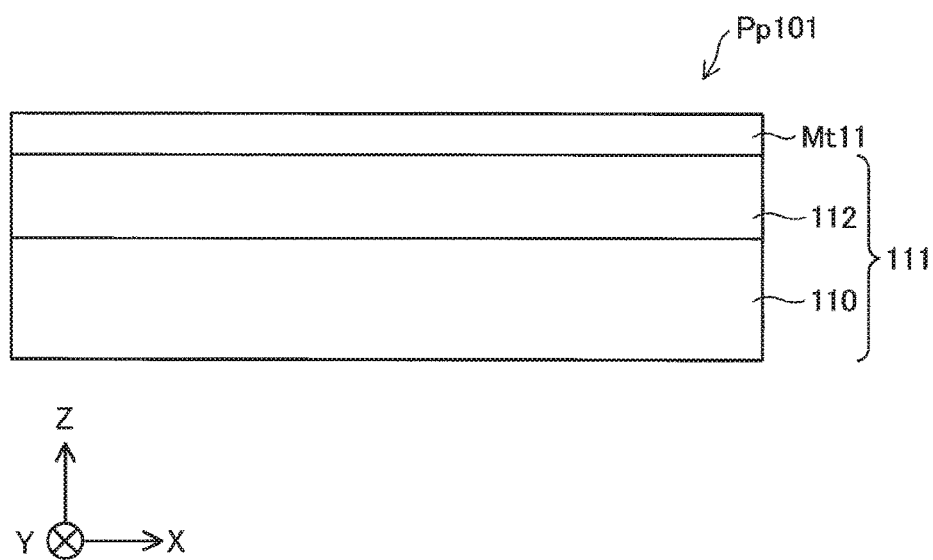
FIG. 3 is a diagram illustrating an intermediate product after process P101.

FIG. 3 is a diagram illustrating an intermediate product Pp101 after process P101. The substrate 110 and the n-type semiconductor layer 112 are both mainly composed of gallium nitride (GaN) and are collectively called "GaN layer 111".

The n-type semiconductor layer 112 is composed of an n-type semiconductor containing silicon (Si) as the donor element. The average value of silicon (Si) concentration contained in the n-type semiconductor layer 112 is approximately $1\times10^{16}$ $cm^{-3}$. The n-type semiconductor layer 112 of approximately 15 μm in thickness is formed at process P101.

The through film Mt11 is a group III nitride-based semiconductor and is made of elements that do not include an element serving as the donor, as the major element. More specifically, the through film Mt11 is mainly composed of aluminum nitride (AlN). The through film Mt11 is formed at a predetermined growth temperature of not lower than 300° C. and not higher than 1500° C. under a predetermined growth pressure of not lower than 100 Torr and not higher than 760 Torr. The through film Mt11 of approximately 30 nm in thickness is formed at process P101.

At process P102 in FIG. 2, the manufacturer forms a mask for ion implantation M1 on part (on the positive (+)-side in the Z-axis direction) of the through film Mt11. More specifically, the manufacturer forms a layer of a photoresist on the through film Mt11 and removes portions of the photoresist layer corresponding to regions for ion implantation by photolithography such as to provide openings on which the through film Mt11 is exposed.

Figure 4:
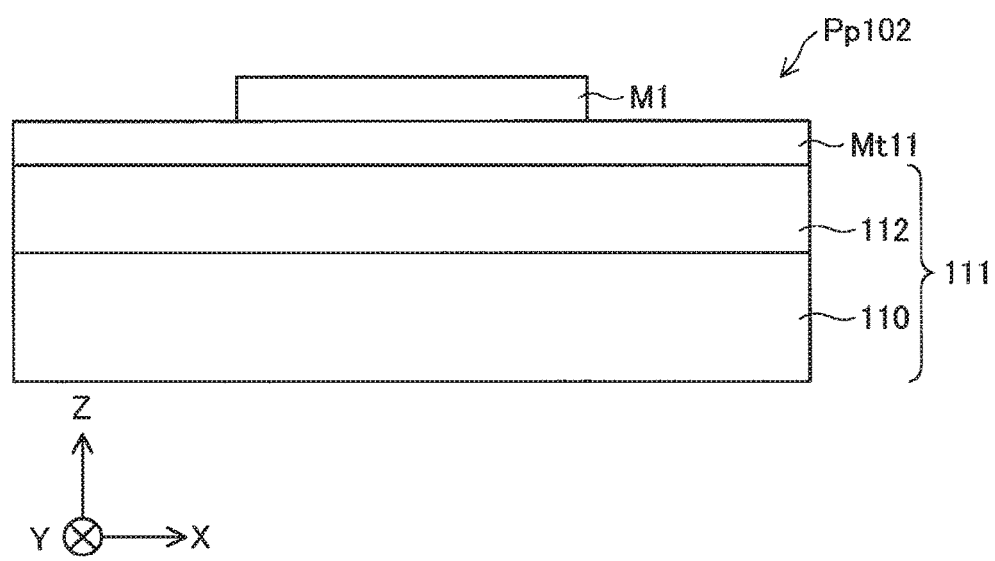
FIG. 4 is a diagram illustrating an intermediate product after process P102.

FIG. 4 is a diagram illustrating an intermediate product Pp102 after process P102. In the intermediate product Pp102, the mask for ion implantation M1 is formed on part of the through film Mt11. FIGS. 4 to 14 illustrate formation of one semiconductor device 100 (shown in FIG. 1) on the substrate 110 for ease of technical understanding. In the actual state, however, a plurality of semiconductor devices 100 are formed at predetermined intervals on the substrate 110.

At process P103 in FIG. 2, the manufacturer implants a p-type impurity into portions of the n-type semiconductor layer 112 by ion implantation. More specifically, the manufacturer implants magnesium atom (Mg) into the intermediate product Pp102 from the positive (+)-side in the Z-axis direction at a predetermined temperature of not lower than 20° C. and not higher than 800° C. This results in implanting the magnesium atom (Mg) in regions of the n-type semiconductor layer 112 without formation of the mask for ion implantation M1, to form p-type semiconductor regions 113p in the portions on the surface side of the n-type semiconductor layer 112.

Ion implantation into the n-type semiconductor layer 112 in the presence of the through film Mt11 formed to have the thickness of not less than 1 nm (thickness of approximately 30 nm according to this embodiment) provides the following advantageous effect. This configuration prevents an impurity such as O and Si from entering into the n-type semiconductor layer 112.

Ion implantation into the n-type semiconductor layer 112 in the presence of the through film Mt11 made of the elements that do not include an element serving as the donor of the p-type semiconductor regions 113, as the major element provides the following advantageous effect. This configuration prevents implantation of a donor element derived from the through film Mt11 into the n-type semiconductor layer 112 ("knock-on").

Ion implantation into the n-type semiconductor layer 112 in the presence of the through film Mt11 formed to have the thickness of not greater than 50 nm (thickness of approximately 30 nm according to this embodiment) provides the following advantageous effect. This configuration enables the magnesium atom (Mg) to be implanted into the n-type semiconductor layer 112, while preventing an impurity such as O and Si from entering into the n-type semiconductor layer 112.

Ion implantation into the n-type semiconductor layer 112 in the presence of the through film Mt11 enables the distribution of concentration of the p-type impurity (magnesium (Mg) according to this embodiment) implanted into the n-type semiconductor layer 112 to be appropriately regulated. In ion implantation, the concentration of the implanted impurity has a distribution close to a Gaussian distribution with respect to the depth direction (Z-axis direction). More specifically, with respect to the depth direction (Z-axis direction), the concentration of the implanted impurity reaches the highest at a certain position that is away from the exposed surface by a predetermined distance and decreases with increases in intervals from the certain position toward the surface side and toward the rear face side. Accordingly, the peak of the concentration of the impurity can be set in the vicinity of the surface of the n-type semiconductor layer 112 by performing ion implantation into the intermediate product Pp102 in the presence of the through film Mt11 that is designed to provide the highest concentration of the magnesium atom (Mg) at a predetermined position inside of the n-type semiconductor layer 112 and in the vicinity of the surface of the n-type semiconductor layer 112, and subsequently removing the through film Mt11.

Figure 5:
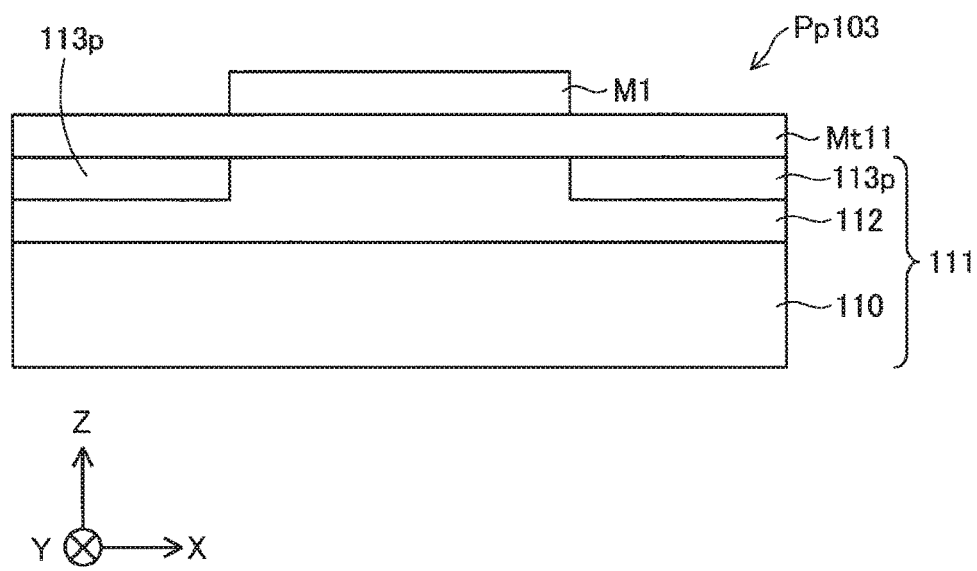
FIG. 5 is a diagram illustrating an intermediate product after process P103.

FIG. 5 is a diagram illustrating an intermediate product Pp103 after process P103. In the intermediate product Pp103, the p-type semiconductor regions 113$p$ containing the magnesium atom (Mg) as the p-type impurity are formed in the regions of the n-type semiconductor layer 112 without the mask for ion implantation M1. The magnesium atom (Mg) contained as the p-type impurity in the p-type semiconductor regions 113$p$ is not activated at this moment.

In the description hereof, the p-type semiconductor region prior to activation of the p-type impurity is expressed as the "p-type semiconductor region 113$p$" and is distinguished from the p-type semiconductor region 113 after activation of the p-type impurity. Since the main component (GaN) of the respective layers is not changed, the substrate 110 and the n-type semiconductor layer 112 with the p-type semiconductor regions 113$p$ partly formed therein are also collectively called "GaN layer 111" (as shown in FIG. 5) in the description hereof.

At process P104 in FIG. 2, the manufacturer removes the mask for ion implantation M1. More specifically, the mask for ion implantation M1 that is the photoresist mask is removed by using an organic solvent.

Figure 6:
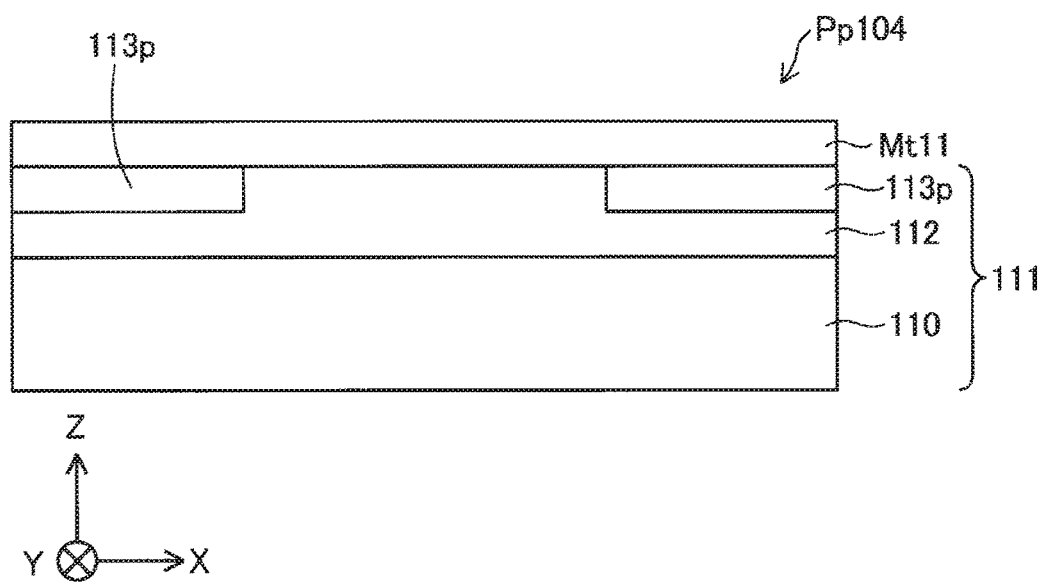
FIG. 6 is a diagram illustrating an intermediate product after process P104.

FIG. 6 is a diagram illustrating an intermediate product Pp104 after process P104. The mask for ion implantation M1 is removed from above the through film Mt11 in the intermediate product Pp104.

At process P105 in FIG. 2, the manufacturer forms a cap layer Mc12 on the through film Mt11. The cap layer Mc12 is mainly composed of aluminum nitride (AlN). The cap layer Mc12 is formed by metal organic chemical vapor deposition (MOCVD) at a predetermined growth temperature of not lower than 300° C. and not higher than 1500° C. under a predetermined growth pressure of not lower than 100 Torr and not higher than 760 Torr. The cap layer Mc12 of approximately 500 nm in thickness is formed at process P105.

Figure 7:
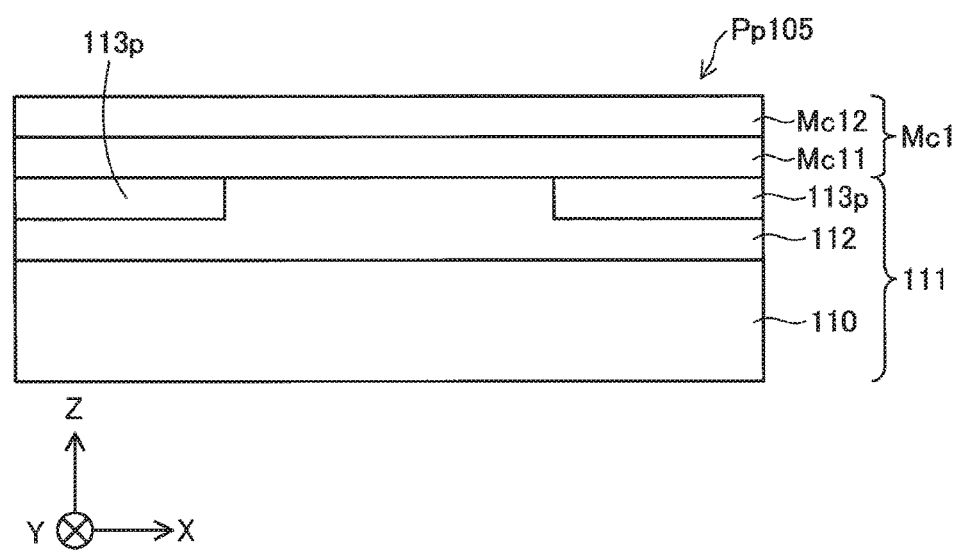
FIG. 7 is a diagram illustrating an intermediate product after process P105.

FIG. 7 is a diagram illustrating an intermediate product Pp105 after process P105. The cap layer Mc12 is formed on the through film Mt11 in the intermediate product Pp105. The through film Mt11 formed at process P101 also serves as a cap layer in heat treatment performed later. The through film Mt11 serving as the cap layer is called "cap layer Mc11". The cap layer Mc11 and the cap layer Mc12 formed at process P105 are collectively called "cap layer Mc1".

At process P106 in FIG. 2, the manufacturer forms a block layer Mb1 on the cap layer Mc1 (cap layer Mc12). The block layer Mb1 is mainly composed of aluminum oxide ($Al_2O_3$). The block layer Mb1 is formed by atomic layer deposition (ALD). The block layer Mb1 of approximately 500 nm in thickness is formed at process P106.

Figure 8:
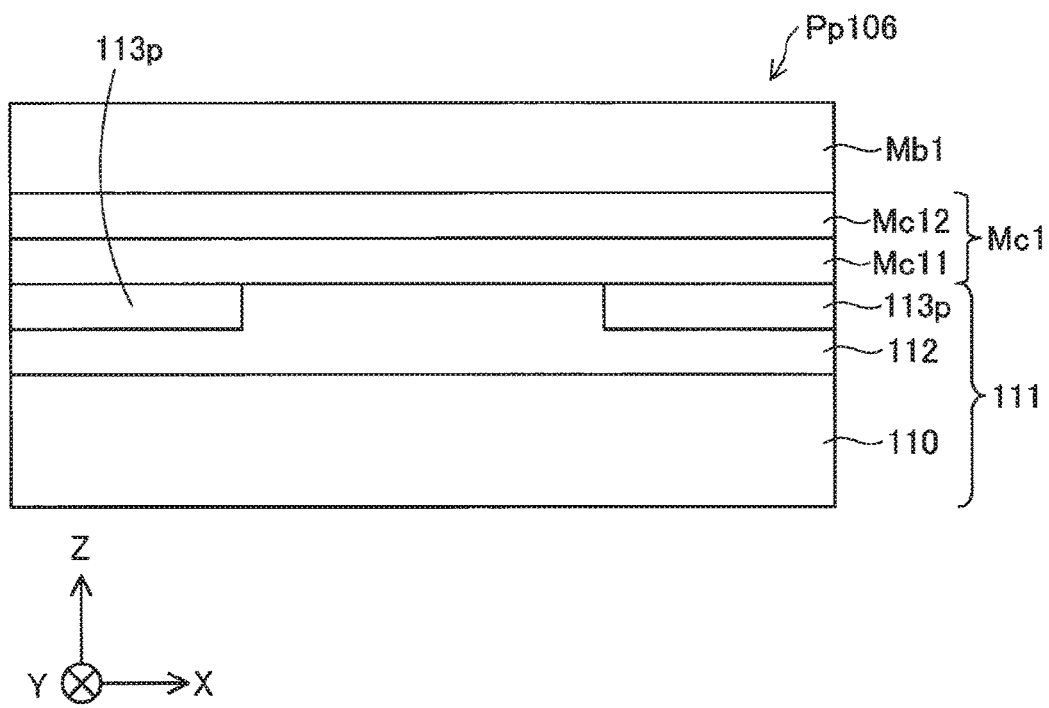
FIG. 8 is a diagram illustrating an intermediate product after process P106.

FIG. 8 is a diagram illustrating an intermediate product Pp106 after process P106. The block layer Mb1 is formed on the cap layer Mc1 in the intermediate product Pp106.

At process P107 in FIG. 2, the manufacturer heats the intermediate product Pp106 (shown in FIG. 8) such as to perform heat treatment of the intermediate product Pp106. In this stage, the surface of the intermediate product Pp106 is covered by the block layer Mb1 serving as a surface layer. The rear face of the intermediate product Pp106 is covered by the substrate 110. In the description herein, the "surface layer" means a layer that covers another layer and is exposed in the atmosphere.

At process P107, the heat treatment is performed at a predetermined temperature of not lower than 800° C. and not higher than 1500° C. (at a target temperature of 1250° C. according to this embodiment). The heat treatment is performed under a predetermined pressure of not lower than 100 Torr and not higher than 760 Torr (under 760 Torr according to this embodiment) in an atmosphere gas containing nitrogen ($N_2$). The heat treatment is performed for a predetermined time period of not shorter than 1 minute and not longer than 60 minutes (for 30 minutes according to this embodiment). The heat treatment performed at process P107 results in activating the magnesium atom (Mg) contained as the p-type impurity in the p-type semiconductor regions 113$p$.

The process of activating the p-type impurity contained in the p-type semiconductor regions 113$p$ in a pressurized environment provides the following advantageous effect. This configuration reduces the likelihood of release of nitrogen (N) from the GaN layer 111 mainly composed of gallium nitride (GaN) (i.e., the substrate 110, the n-type semiconductor layer 112 and the p-type semiconductor regions 113).

Figure 9:
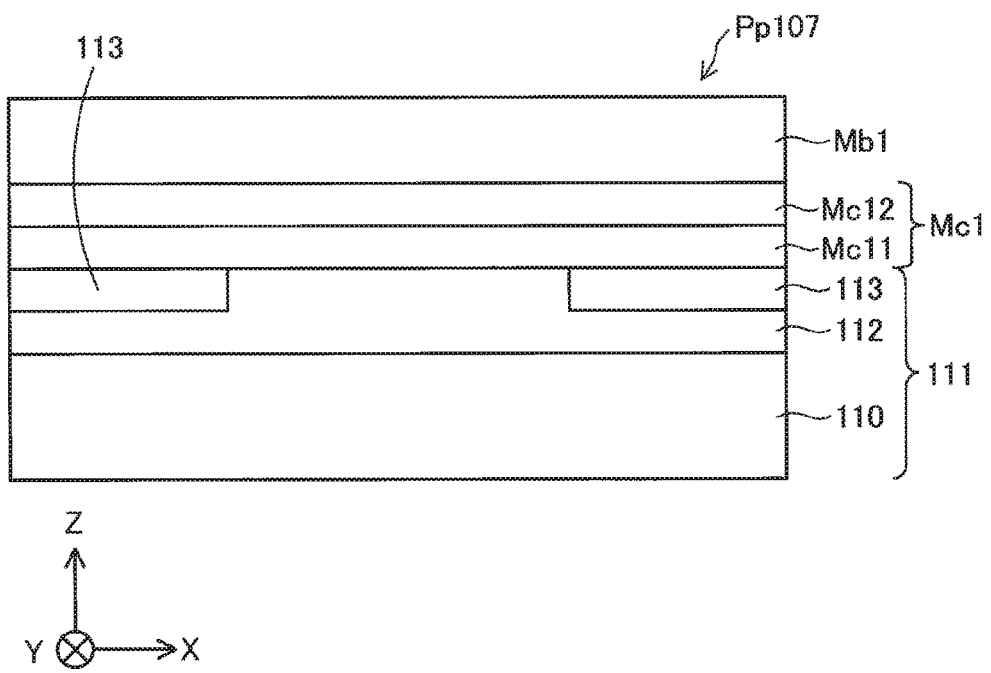
FIG. 9 is a diagram illustrating an intermediate product after process P107.

FIG. 9 is a diagram illustrating an intermediate product Pp107 after process P107. The p-type semiconductor regions 113 after activation of the p-type impurity are formed in the portions on the surface side of the n-type semiconductor layer 112 in the intermediate product Pp107. Since the main component (GaN) of the respective layers is not changed, the substrate 110 and the n-type semiconductor layer 112 with the p-type semiconductor regions 113 partly formed therein are also collectively called "GaN layer 111" in the description hereof.

The respective layers of the intermediate product Pp106 (shown in FIG. 8) are thermally expanded by the heat treatment at process P107. According to this embodiment, the cap layer Mc1 consists of the cap layer Mc11 (through film Mt11) that is mainly composed of aluminum nitride (AlN) and the cap layer Mc12 that is also mainly composed of aluminum nitride (AlN). The substrate 110, the n-type semiconductor layer 112 and the p-type semiconductor regions 113 are, on the other hand, mainly composed of gallium nitride (GaN). Accordingly the coefficient of thermal expansion of the cap layer Mc1 is smaller than the coefficient of thermal expansion of the substrate 110, the n-type semiconductor layer 112 and the p-type semiconductor regions 113. The coefficient of thermal expansion of AlN (cap layer Mc1) is $4.6 \times 10^{-6}$/K. The coefficient of thermal expansion of GaN (GaN layer 111) is $5.6 \times 10^{-6}$/K.

The block layer Mb1 is mainly composed of aluminum oxide ($Al_2O_3$). Accordingly the coefficient of thermal expansion of the cap layer Mc1 is smaller than the coefficient of thermal expansion of the block layer Mb1. The coefficient of thermal expansion of the block layer Mb1 is larger than the coefficient of thermal expansion of the GaN layer 111. The coefficient of thermal expansion of AlN (cap layer Mc1) is $4.6 \times 10^{-6}$/K. The coefficient of thermal expansion of GaN (GaN layer 111) is $5.6 \times 10^{-6}$/K. The coefficient of thermal expansion of $Al_2O_3$ (block layer Mb1) is $7.3 \times 10^{-6}$/K.

The following phenomenon occurs during the heat treatment at process P107, due to such differences in the coefficient of thermal expansion among the respective layers. The block layer Mb1 adjacent to the positive (+)-side in the Z-axis direction of the cap layer Mc1 is expected to be expanded by a largest amount. The GaN layer 111 adjacent to the negative (−)-side in the Z-axis direction of the cap layer Mc1 is expected to be expanded by a second largest amount. The cap layer Mc1 has the smallest amount of thermal expansion, compared with the block layer Mb1 and the GaN layer 111.

The cap layer Mc1 receives a force of extending the cap layer Mc1 in a direction perpendicular to a stacking direction of the respective layers (hereinafter this force is called "force in the extension direction") from the GaN layer 111 adjacent to the rear face of the cap layer Mc1 during the heat treatment at process P107. The stacking direction of the respective layers corresponds to the top-bottom direction in FIG. 1 and FIGS. 3 to 14. The direction perpendicular to the stacking direction of the respective layers corresponds to the left-right direction in FIG. 1 and FIGS. 3 to 14.

The cap layer Mc1 also receives a force in the extension direction from the block layer Mb1 adjacent to the surface of the cap layer Mc1 during the heat treatment at process P107. Neither the surface nor the rear face of the cap layer Mc1 is, however, exposed in the atmosphere (as shown in FIG. 9).

In general, cracking occurs from the surface exposed in the atmosphere and is extended from a small crack occurring on the surface. The cap layer Mc1 has neither the surface nor the rear face exposed in the atmosphere. The cap layer Mc1 receives the force in the extension direction from both the surface side and the rear face side during the heat treatment at process P107. There is, however, little possibility that cracking occurs from the cap layer Mc1.

The block layer Mb1, on the other hand, receives a force of compressing the block layer Mb1 in the direction perpendicular to the stacking direction of the respective layers (hereinafter this force is called "force in the compression direction") from the cap layer Mc1 adjacent to the rear face (negative (−)-side in the Z-axis direction) of the block layer Mb1 during the heat treatment at process P107. Unlike the force in the extension direction, however, the force in the compression direction does not serve to cause cracking in the block layer Mb1. There is accordingly little possibility that cracking occurs from the exposed surface of the block layer Mb1.

The GaN layer 111 consisting of the substrate 110, the n-type semiconductor layer 112 and the p-type semiconductor regions 113 also receives the force in the compression direction from the cap layer Mc1 adjacent to the surface (positive (+)-side in the Z-axis direction) of the GaN layer 111 during the heat treatment at process P107. The force in the compression direction, however, does not serve to cause cracking in the GaN layer 111 or more specifically in the substrate 110 having the exposed rear face. Additionally, the GaN layer 111 or more specifically the substrate 110 has sufficient thickness, compared with the cap layer Mc1 and the block layer Mb1. There is accordingly little possibility that cracking occurs from the exposed rear face of the substrate 110.

(i) The thickness of the block layer Mb1 is approximately 500 nm. (ii) The thickness of the cap layer Mc11 (through film Mt11) is approximately 30 nm. The thickness of the cap layer Mc12 is approximately 500 nm. As a result, the thickness of the cap layer Mc1 is approximately 530 nm. (iii) The thickness of the substrate 110 is, on the other hand, approximately 300 μm. The thickness of the n-type semiconductor layer 112 is approximately 15 μm. As a result, the thickness of the GaN layer 111 is approximately 315 μm. Accordingly the thickness of the GaN layer 111 is approximately 600 times the thickness of the block layer Mb1 or the thickness of the cap layer Mc1.

The coefficient of thermal expansion of the block layer Mb1 is larger than the coefficient of thermal expansion of the GaN layer 111. The thickness of the block layer Mb1 is, on the other hand, smaller than the thickness of the GaN layer 111. Accordingly the configuration of this embodiment provides a smaller difference between the magnitude of the force in the extension direction that the cap layer Mc1 receives from the surface and the magnitude of the force in the extension direction that the cap layer Mc1 receives from the rear face, compared with a configuration that the coefficient of thermal expansion of the block layer Mb1 is smaller than the coefficient of thermal expansion of the GaN layer 111. This configuration results in providing a smaller deviation of the strain in the cap layer Mc1. From this point of view, there is little possibility that first cracking occurs in the cap layer Mc1.

After formation of the through film Mt11 (cap layer Mc11) at process P101, the cap layer Mc12 having the same main component is formed on the through film Mt11 (cap layer Mc11) at process P105. The heat treatment is subsequently performed at process P107. This configuration enables the magnesium atom (Mg) to be implanted into the n-type semiconductor layer 112 through the thin through film Mt11 (cap layer Mc11) at process P103 performed after process P101 and before process P105. At process P107 performed after process P105, on the other hand, the cap layer Mc1 having the sufficient thickness (the cap layer Mc11 and the cap layer Mc12) serves to absorb the force in the extension direction applied from both the surface and the rear face.

As described above, there is little possibility that cracking occurs from the surface (block layer Mb1), from the rear face (substrate 110), and from the intermediate layer (cap layer Mc1) in the intermediate product Pp106 during the heat treatment at process P107. Accordingly the intermediate product Pp106 is less likely to cause cracking as a whole during the heat treatment at process P107. As a result, for example, even when the substrate 110 is a substrate having the area of 1 inch or larger diameter, cracking is less likely to occur in the block layer Mb1 or in the cap layer Mc1 and is thereby less likely to damage the surface of the n-type semiconductor layer 112 and the p-type semiconductor regions 113p exposed in the atmosphere. The block layer Mb1 and the cap layer Mc1 accordingly serve to protect the whole surface of the GaN layer 111 and achieve a change to the p-type of the p-type semiconductor regions 113p arranged in the GaN layer 111 (i.e., activate the p-type impurity in the p-type semiconductor regions 113p).

At process P108 in FIG. 2, the manufacturer removes the block layer Mb1. More specifically, the block layer Mb1 is removed by using an aqueous solution of hydrogen fluoride.

Figure 10:
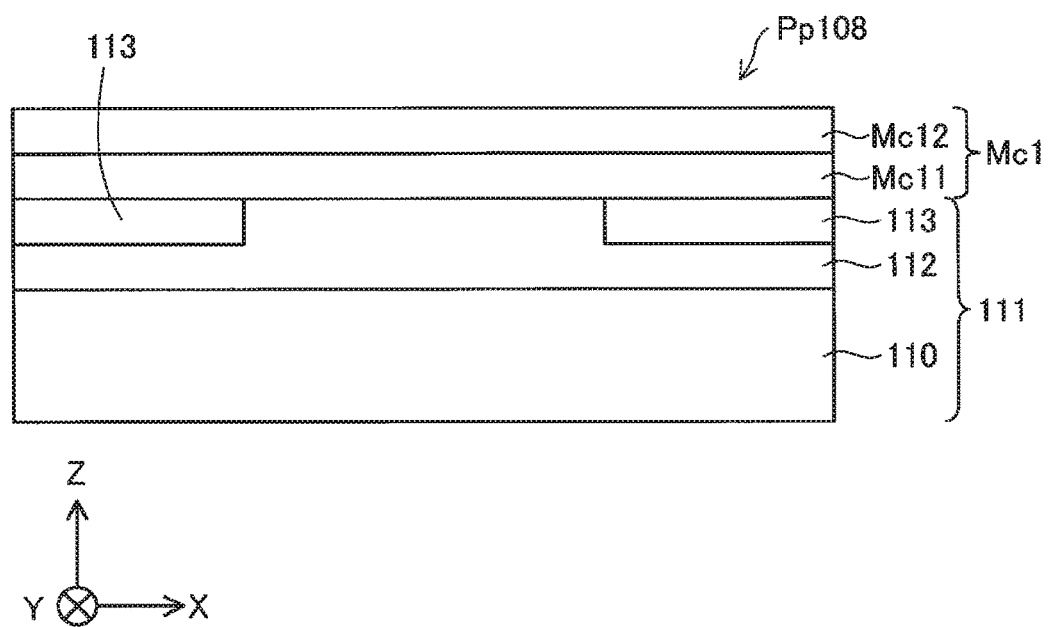
FIG. 10 is a diagram illustrating an intermediate product after process P108.

FIG. 10 is a diagram illustrating an intermediate product Pp108 after process P108. The block layer Mb1 is removed from above the cap layer Mc1 in the intermediate product Pp108.

At process P109 in FIG. 2, the manufacturer removes the cap layer Mc1. More specifically, the cap layer Mc1 is removed by wet etching using tetramethylammonium hydroxide (TMAH) of pH 12 at a predetermined temperature of not lower than 65° C. and not higher than 85° C. Both the cap layer Mc11 (through film Mt11) and the cap layer Mc12 constituting the cap layer Mc1 are removed at process P109.

Figure 11:
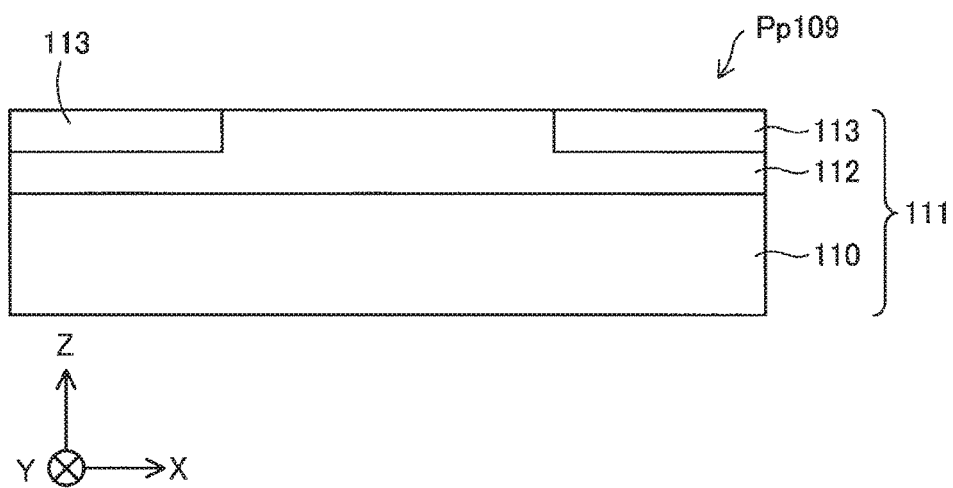
FIG. 11 is a diagram illustrating an intermediate product after process P109.

FIG. 11 is a diagram illustrating an intermediate product Pp109 after process P109. The cap layer Mc1 is removed from above the n-type semiconductor layer 112 and the p-type semiconductor regions 113 in the intermediate product Pp109.

At process P110 in FIG. 2, the manufacturer forms the p-type semiconductor layer 114 on the n-type semiconductor layer 112 and on the p-type semiconductor regions 113. The manufacturer further forms the n-type semiconductor layer 116 on the p-type semiconductor layer 114. The p-type semiconductor layer 114 and the n-type semiconductor layer 116 are formed by metal organic chemical vapor deposition (MOCVD).

Figure 12:
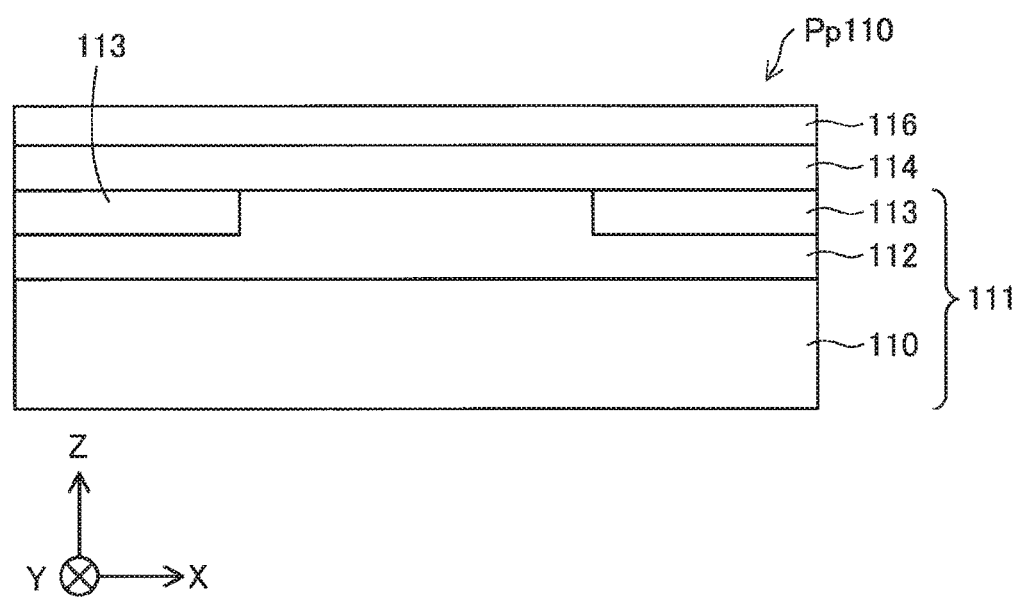
FIG. 12 is a diagram illustrating an intermediate product after process P110.

FIG. 12 is a diagram illustrating an intermediate product Pp110 after process P110. The p-type semiconductor layer 114 and the n-type semiconductor layer 116 are formed on the n-type semiconductor layer 112 and on the p-type semiconductor regions 113 in the intermediate product Pp110.

At process P111 in FIG. 2, the manufacturer forms the trench 122 by dry etching. The manufacturer also forms the recesses 124 by dry etching.

Figure 13:
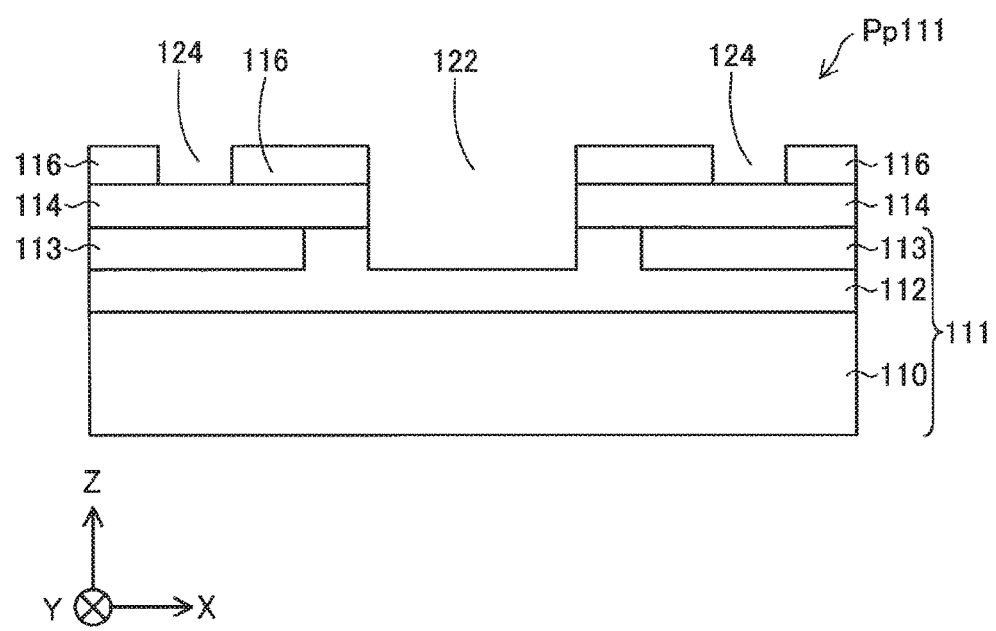
FIG. 13 is a diagram illustrating an intermediate product after process P111.

FIG. 13 is a diagram illustrating an intermediate product Pp111 after process P111. In the intermediate product Pp111, the trench 122 is formed to be recessed in the Z-axis direction from the surface of the n-type semiconductor layer 116, to pass through the p-type semiconductor layer 114 and reach the n-type semiconductor layer 112. In the intermediate product Pp111, the recesses 124 are also formed to be recessed in the Z-axis direction from the surface of the n-type semiconductor layer 116, to pass through the n-type semiconductor layer 116 and reach the surface of the p-type semiconductor layer 114.

At process P112 in FIG. 2, the manufacturer forms the insulating film 130. More specifically, the insulating film 130 is formed by atomic layer deposition (ALD).

Figure 14:
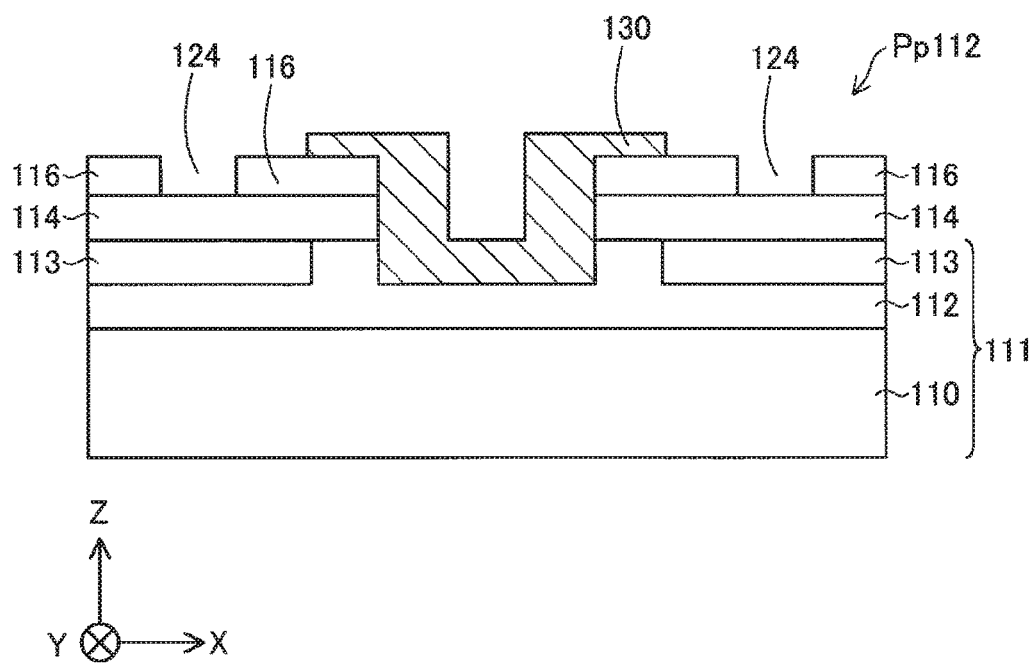
FIG. 14 is a diagram illustrating an intermediate product after process P112.

FIG. 14 is a diagram illustrating an intermediate product Pp112 after process P112. In the intermediate product Pp112, the insulating film 130 is continuously formed on the inner face of the trench 122 and on part of the surface of the n-type semiconductor layer 116 forming the outer periphery of the trench 122.

At process P113 in FIG. 2, the manufacturer forms the gate electrode 142, the body electrodes 144, the source electrodes 146 and the drain electrode 148 in the intermediate product Pp112 (shown in FIG. 14).

Completion of process P113 completes the semiconductor device 100 shown in FIG. 1. In the semiconductor device 100, the gate electrode 142 is formed inside of the trench 122 that is covered with the insulating film 130, and on the insulating film 130 that is formed on the n-type semiconductor layer 116 forming the outer periphery of the trench 122. The body electrode 144 is formed in the recess 124. The source electrode 146 is provided continuously on the body electrode 144 and on part of the n-type semiconductor layer 116. The drain electrode 148 is formed on the rear face of the substrate 110.

The GaN layer 111 according to this embodiment may be referred to as the "semiconductor layer". The cap layer Mc1 may be referred to as the "cap layer". The cap layer Mc11 (through film Mt11) may be referred to as "at least part of the cap layer". The cap layer Mc12 may be referred to as "another part of the cap layer". The block layer Mb1 may be referred to as the "block layer".

Formation of the n-type semiconductor layer 112 at process P101 according to this embodiment may be referred to as the "growing the semiconductor layer". Formation of the through film Mt11 at process P101 may be referred to as the "forming at least part of the cap layer". Process P103 may be referred to as the "implanting the p-type impurity into the semiconductor layer by ion implantation". Process P105 may be referred to as the "forming another part of the cap layer". Process P106 may be referred to as the "forming the block layer on the cap layer". Process P107 may be referred to as the "heating the semiconductor layer such as to activate the p-type impurity".

B. Second Embodiment

B1. Configuration of Semiconductor Device

Figure 15:
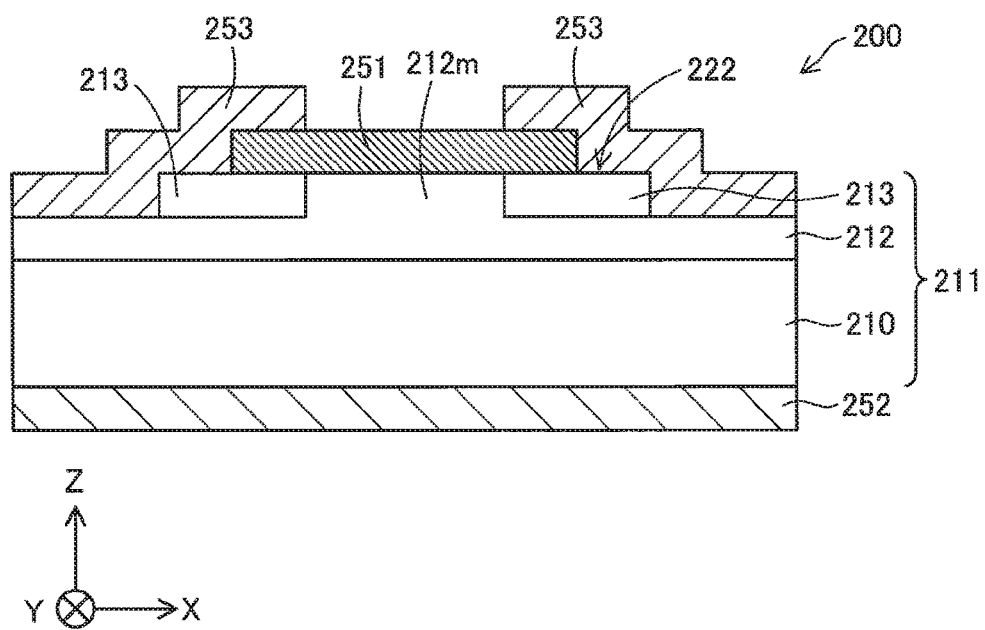
FIG. 15 is a sectional view schematically illustrating the configuration of a semiconductor device according to a second embodiment.

FIG. 15 is a sectional view schematically illustrating the configuration of a semiconductor device 200 according to a second embodiment. The semiconductor device 200 is a GaN-based semiconductor device made by mainly using gallium nitride (GaN). The semiconductor device 200 is a Schottky barrier diode. The semiconductor device 200 is used for power control and is also called power device.

The semiconductor device 200 is configured to include a substrate 210, an n-type semiconductor layer 212 and p-type semiconductor regions 213. The semiconductor device 200 also includes an anode electrode 251, a cathode electrode 252 and an insulating film 253.

The substrate 210 is a plate-like semiconductor extended along the X axis and the Y axis. The substrate 210 has a thickness of approximately 300 μm. The substrate 210 is mainly composed of a group III nitride semiconductor. More specifically, the substrate 210 is mainly composed of gallium nitride (GaN). The substrate 210 is an n-type semiconductor containing silicon (Si) as the donor element. The average value of silicon (Si) concentration contained in the substrate 210 is approximately $5 \times 10^{18}$ cm$^{-3}$.

The n-type semiconductor layer 212 and the p-type semiconductor regions 213 are composed of a group III nitride semiconductor. More specifically, the n-type semiconductor layer 212 and the p-type semiconductor regions 213 are mainly composed of gallium nitride (GaN). The substrate 210, the n-type semiconductor layer 212 and the p-type semiconductor regions 213 that are all mainly composed of gallium nitride (GaN) are collectively called "GaN layer 211" in the description below.

The n-type semiconductor layer 212 is a layer that is located on a positive (+)-side in the Z-axis direction of the substrate 210 and is extended along the X axis and the Y axis. The n-type semiconductor layer 212 has a thickness of approximately 15 μm. The n-type semiconductor layer 212 is composed of an n-type semiconductor containing silicon (Si) as the donor element. The average value of silicon (Si) concentration contained in the n-type semiconductor layer 212 is approximately $1 \times 10^{16}$ cm$^{-3}$.

The p-type semiconductor regions 213 are located on respective sides of a portion 212m of the n-type semiconductor layer 212 that is protruded toward the positive (+)-side in the Z-axis direction. The protruded portion 212m of the n-type semiconductor layer 212 and the p-type semiconductor regions 213 provided on the respective sides thereof form a mesa portion 222 that is protruded toward the positive (+)-side in the Z-axis direction in the GaN layer 211.

The p-type semiconductor regions 213 are regions formed by ion implantation of a p-type impurity into partial regions of the n-type semiconductor layer 212. The p-type semiconductor region 213 occupies a portion from the surface of the n-type semiconductor layer 212 to a depth in the n-type semiconductor layer 212 (i.e., a range corresponding to the depth to the surface of the n-type semiconductor layer 212 other than the protruded portion 212m with respect to the Z-axis direction). The p-type semiconductor region 213 has a depth of approximately 0.4 μm from the surface of the n-type semiconductor layer 212. The p-type impurity (acceptor) contained in the p-type semiconductor regions 213 is magnesium (Mg). The average value of magnesium (Mg) concentration contained in the p-type semiconductor regions 213 is approximately $5 \times 10^{19}$ cm$^{-3}$.

The anode electrode 251 is continuously formed on the protruded portion 212m of the n-type semiconductor layer 212 and on respective adjacent parts, which are near to the protruded portion 212m, of the p-type semiconductor regions 213 formed on the respective sides of the protruded portion 212m. The anode electrode 251 is mainly made of nickel (Ni). The anode electrode 251 forms a Schottky junction with the surface of the protruded portion 212m of the n-type semiconductor layer 212.

The insulating film 253 is continuously formed on remaining portions of the n-type semiconductor layer 212 other than the mesa portion 222, on remaining portions of the p-type semiconductor regions 213 without formation of the anode electrode 251 and on portions of the anode electrode 251. The insulating film 253 is a film having electrical insulating property. More specifically, the insulating film 253 is mainly composed of silicon dioxide (SiO$_2$).

The cathode electrode 252 is formed on the rear face of the substrate 210. The cathode electrode 252 includes a layer mainly made of titanium (Ti) and a layer mainly made of aluminum (Al), which are arranged sequentially from the substrate 210-side. The cathode electrode 252 forms an ohmic contact with the substrate 210.

In the semiconductor device 200, when a positive voltage is applied to the anode electrode 251, a Schottky barrier on the boundary between the anode electrode 251 and the surface of the protruded portion 212m of the n-type semiconductor layer 212 is lowered, such as to establish electrical continuity between the anode electrode 251 and the cathode electrode 252.

B2. Manufacturing Method of Semiconductor Device

Figure 16:
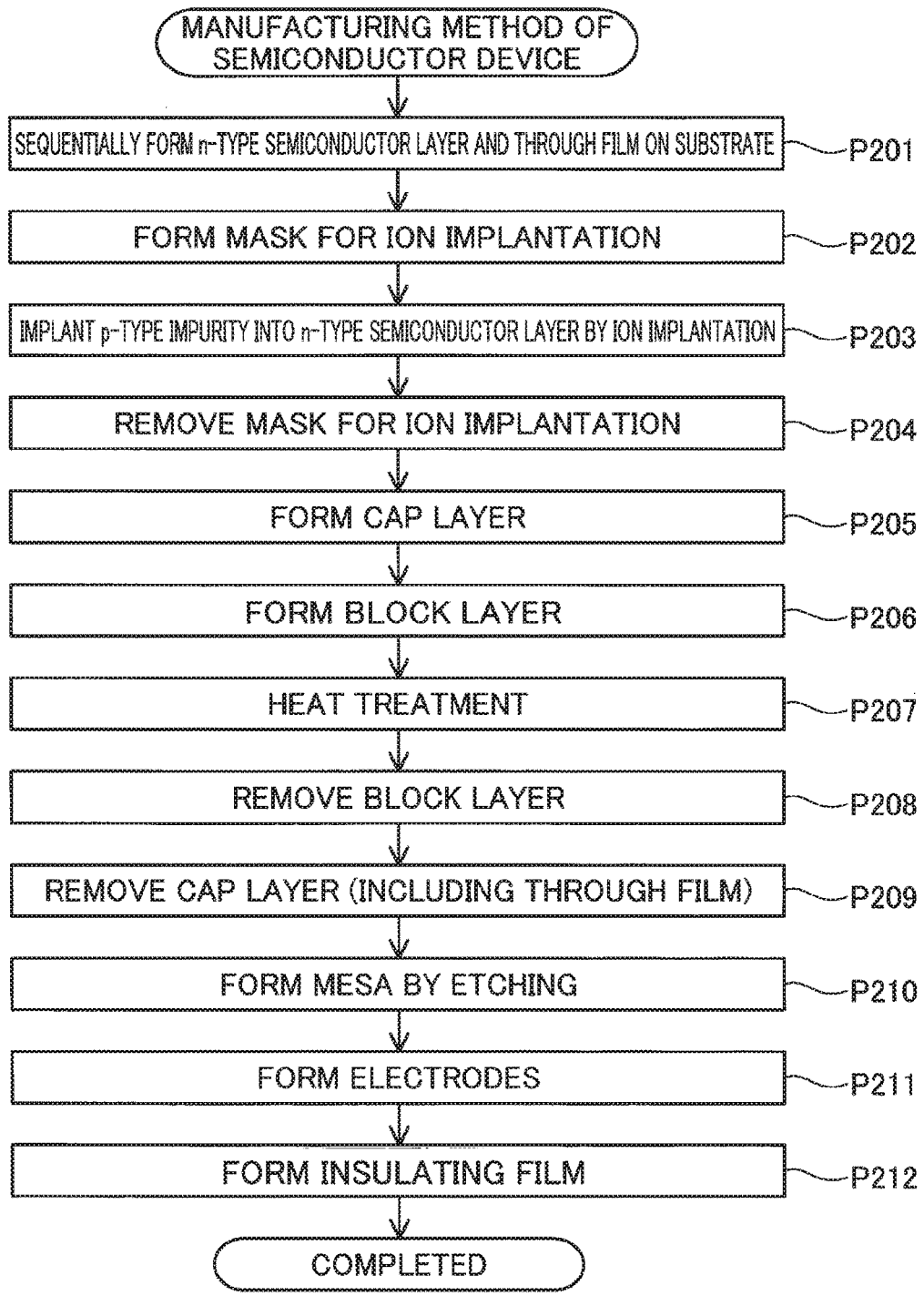
FIG. 16 is a flowchart showing a manufacturing method of the semiconductor device according to the second embodiment.

FIG. 16 is a flowchart showing a manufacturing method of the semiconductor device 200 according to the second embodiment. The following describes the manufacturing method of the semiconductor device 200 according to the second embodiment.

At process P201, the manufacturer first provides the substrate 210. The substrate 210 is an n-type semiconductor that is mainly composed of gallium nitride (GaN) and contains silicon (Si) as the donor element. The manufacturer then sequentially forms the n-type semiconductor layer 212 and a through film Mt21 in this order on the substrate 210. The n-type semiconductor layer 212 and the through film Mt21 are formed by metal organic chemical vapor deposition (MOCVD).

Figure 17:
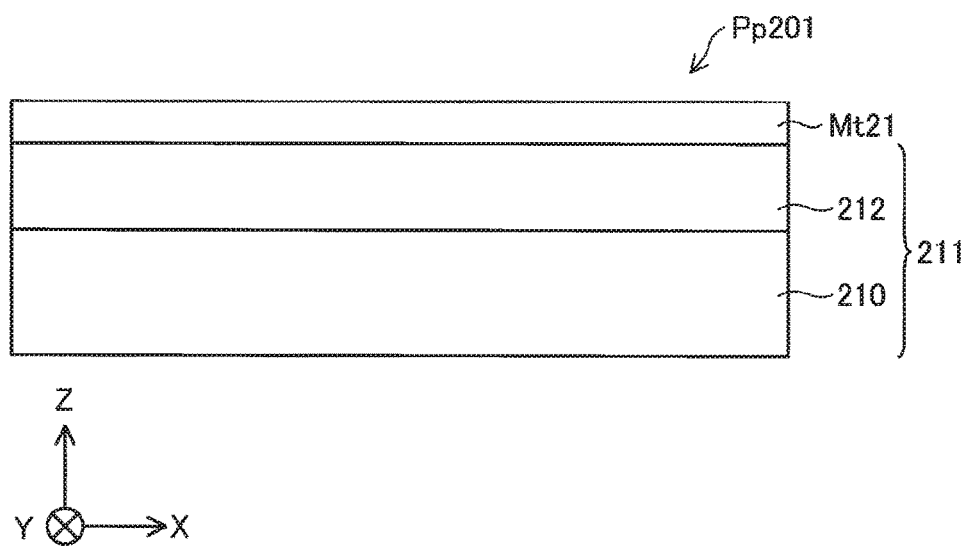
FIG. 17 is a diagram illustrating an intermediate product after process P201.

FIG. 17 is a diagram illustrating an intermediate product Pp201 after process P201. The n-type semiconductor layer 212 and the through film Mt21 are formed on the substrate 210 in the intermediate product Pp201. Since the main component (GaN) of the respective layers is not changed until completion of the semiconductor device 200, the substrate 210 and the n-type semiconductor layer 212 that are both mainly composed of gallium nitride (GaN) are collectively called "GaN layer 211" (as shown in FIG. 15 and FIG. 17).

The n-type semiconductor layer 212 is composed of an n-type semiconductor containing silicon (Si) as the donor element. The average value of silicon (Si) concentration contained in the n-type semiconductor layer 212 is approximately $1 \times 10^{16}$ cm$^{-3}$. The n-type semiconductor layer 212 of approximately 15 μm in thickness is formed at process P201.

The through film Mt21 is a group III nitride-based semiconductor and is made of elements that do not include an element serving as the donor, as the major element. More specifically, the through film Mt21 is mainly composed of aluminum nitride (AlN). The through film Mt21 is formed at a predetermined growth temperature of not lower than 300° C. and not higher than 1500° C. under a predetermined growth pressure of not lower than 100 Torr and not higher than 760 Torr. The through film Mt21 of approximately 30 nm in thickness is formed at process P201.

At process P202 in FIG. 16, the manufacturer forms a mask for ion implantation M2 on part (on the positive (+)-side in the Z-axis direction) of the through film Mt21. More specifically, the manufacturer forms a layer of a photoresist on the through film Mt21 and removes portions of the photoresist layer corresponding to regions for ion implantation by photolithography to provide openings on which the through film Mt21 is exposed.

Figure 18:
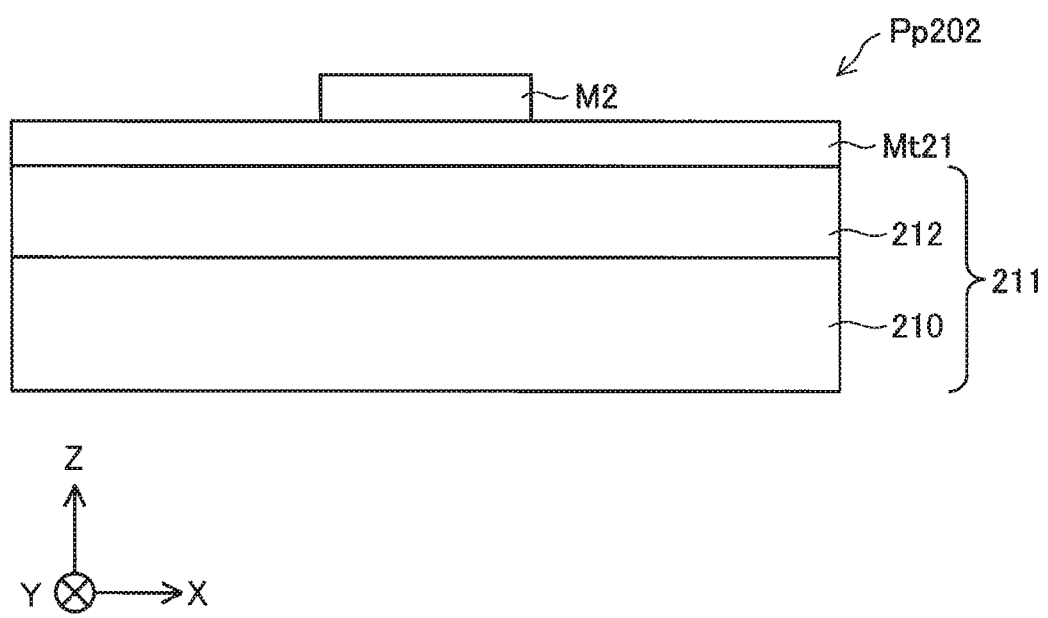
FIG. 18 is a diagram illustrating an intermediate product after process P202.

FIG. 18 is a diagram illustrating an intermediate product Pp202 after process P202. In the intermediate product Pp202, the mask for ion implantation M2 is formed on part of the through film Mt21. FIGS. 18 to 27 illustrate formation of one semiconductor device 200 (shown in FIG. 15) on the substrate 210 for ease of technical understanding. In the actual state, however, a plurality of semiconductor devices 200 are formed at predetermined intervals on the substrate 210.

At process P203 in FIG. 16, the manufacturer performs ion implantation into the intermediate product Pp202 (shown in FIG. 18) such as to implant a p-type impurity into portions of the n-type semiconductor layer 212. More specifically, the manufacturer implants magnesium atom (Mg) into the intermediate product Pp202 from the positive (+)-side in the Z-axis direction at a predetermined temperature of not lower than 20° C. and not higher than 800° C. This results in implanting the magnesium atom (Mg) in regions of the n-type semiconductor layer 212 without formation of the mask for ion implantation M2, to form p-type semiconductor regions 213p in the portions on the surface side of the n-type semiconductor layer 212.

Ion implantation into the n-type semiconductor layer 212 in the presence of the through film Mt21 provides the similar advantageous effects to those of the first embodiment. This configuration prevents an impurity such as O and Si from entering into the n-type semiconductor layer 212. This configuration also prevents implantation of a donor element derived from the through film Mt21 into the n-type semiconductor layer 212 ("knock-on"). This configuration further enables the magnesium atom (Mg) to be implanted into the n-type semiconductor layer 212. This configuration additionally enables the distribution of concentration of the p-type impurity (magnesium (Mg) according to this embodiment) implanted into the n-type semiconductor layer 212 to be appropriately regulated.

Figure 19:
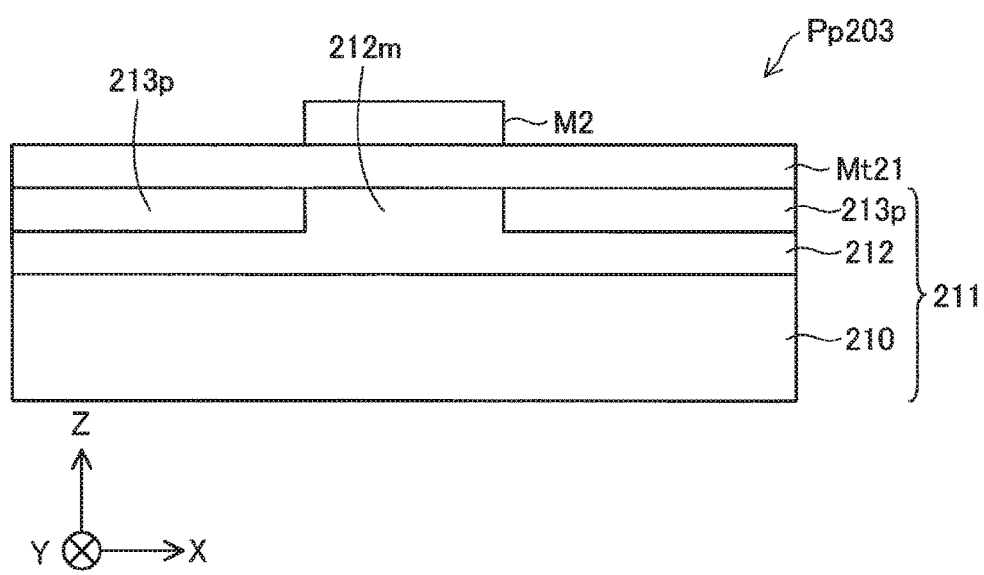
FIG. 19 is a diagram illustrating an intermediate product after process P203.

FIG. 19 is a diagram illustrating an intermediate product Pp203 after process P203. In the intermediate product Pp203, the p-type semiconductor regions 213p containing the magnesium atom (Mg) as the p-type impurity are formed in the regions of the n-type semiconductor layer 212 without the mask for ion implantation M2. The magnesium atom (Mg) contained as the p-type impurity in the p-type semiconductor regions 213p is not activated at this moment.

In the description hereof, the p-type semiconductor region prior to activation of the p-type impurity is expressed as the "p-type semiconductor region 213p" and is distinguished from the p-type semiconductor region 213 after activation of the p-type impurity. A portion of the n-type semiconductor layer 212 located between the two p-type semiconductor regions 213p formed at process P203 is the protruded portion 212m. Since the main component (GaN) of the respective layers is not changed, the substrate 210 and the n-type semiconductor layer 212 with the p-type semiconductor regions 213p partly formed therein are also collectively called "GaN layer 211" in the description hereof.

At process P204 in FIG. 16, the manufacturer removes the mask for ion implantation M2. More specifically, the mask for ion implantation M2 that is the photoresist mask is removed by using an organic solvent.

Figure 20:
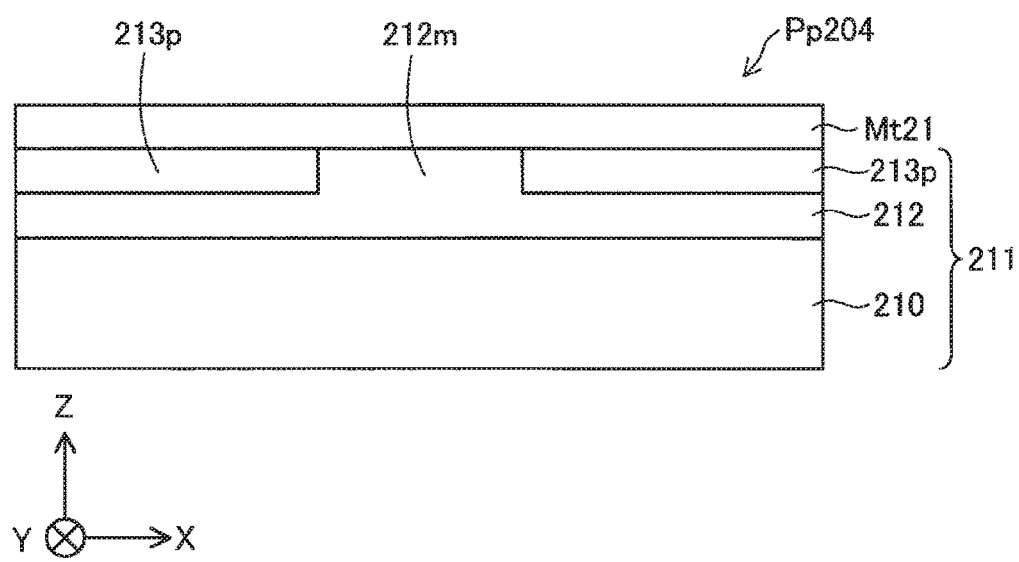
FIG. 20 is a diagram illustrating an intermediate product after process P204.

FIG. 20 is a diagram illustrating an intermediate product Pp204 after process P204. The mask for ion implantation M2 is removed from above the through film Mt21 in the intermediate product Pp204.

At process P205 in FIG. 16, the manufacturer forms a cap layer Mc22 on the through film Mt21. The cap layer Mc22 is mainly composed of aluminum nitride (AlN). The cap layer Mc22 is formed by metal organic chemical vapor deposition (MOCVD) at a predetermined growth temperature of not lower than 300° C. and not higher than 1500° C. under a predetermined growth pressure of not lower than 100 Torr and not higher than 760 Torr. The cap layer Mc22 of approximately 400 nm in thickness is formed at process P205.

Figure 21:
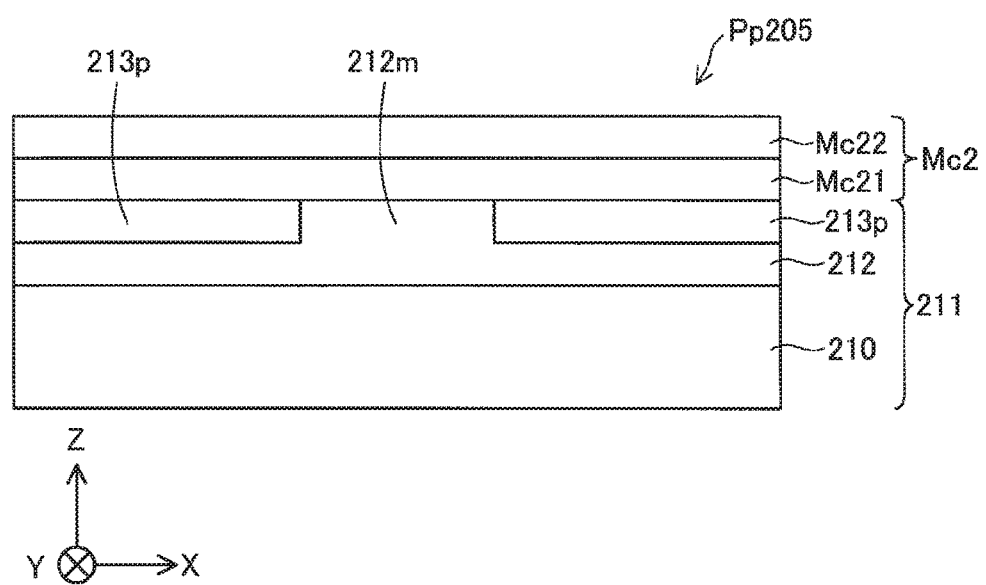
FIG. 21 is a diagram illustrating an intermediate product after process P205.

FIG. 21 is a diagram illustrating an intermediate product Pp205 after process P205. The cap layer Mc22 is formed on the through film Mt21 in the intermediate product Pp205. The through film Mt21 formed at process P201 also serves as a cap layer in heat treatment performed later. The through film Mt21 serving as the cap layer is called "cap layer Mc21". The cap layer Mc21 and the cap layer Mc22 formed at process P205 are collectively called "cap layer Mc2".

At process P206 in FIG. 16, the manufacturer forms a block layer Mb2 on the cap layer Mc2 (cap layer Mc22). The block layer Mb2 is mainly composed of aluminum oxide ($Al_2O_3$). The block layer Mb2 is formed by atomic layer deposition (ALD). The block layer Mb2 of approximately 400 nm in thickness is formed at process P206.

Figure 22:
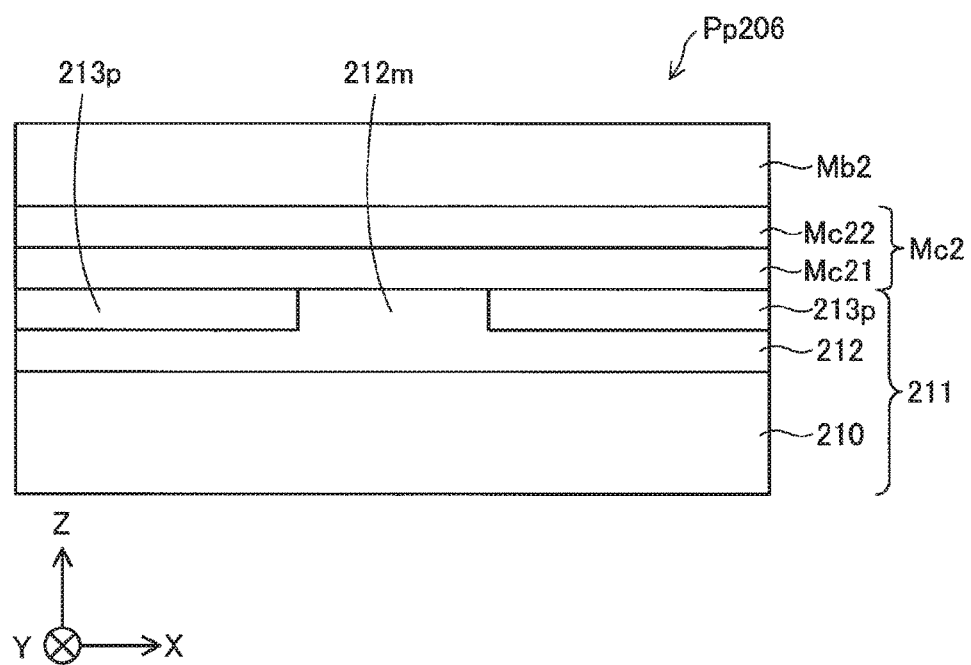
FIG. 22 is a diagram illustrating an intermediate product after process P206.

FIG. 22 is a diagram illustrating an intermediate product Pp206 after process P206. The block layer Mb2 is formed on the cap layer Mc2 in the intermediate product Pp206.

At process P207 in FIG. 16, the manufacturer heats the intermediate product Pp206 (shown in FIG. 22) such as to perform heat treatment of the intermediate product Pp206. In this stage, the surface of the intermediate product Pp206 is covered by the block layer Mb2 serving as a surface layer. The rear face of the intermediate product Pp206 is covered by the substrate 210. At process P207, the heat treatment is performed at a predetermined temperature of not lower than 800° C. and not higher than 1500° C. (at 1250° C. according to this embodiment).

At process P207, the heat treatment is performed under a predetermined pressure of not lower than 100 Torr and not higher than 760 Torr (under 760 Torr according to this embodiment) in an atmosphere gas containing nitrogen ($N_2$). The heat treatment is performed for a predetermined time period of not shorter than 1 minute and not longer than 60 minutes (for 30 minutes according to this embodiment). The heat treatment performed at process P207 results in activating the magnesium atom (Mg) contained as the p-type impurity in the p-type semiconductor regions 213p.

The process of activating the p-type impurity contained in the p-type semiconductor regions 213p in a pressurized environment reduces the likelihood of release of nitrogen (N) from the GaN layer 211 (i.e., the substrate 210, the n-type semiconductor layer 212 and the p-type semiconductor regions 213).

Figure 23:
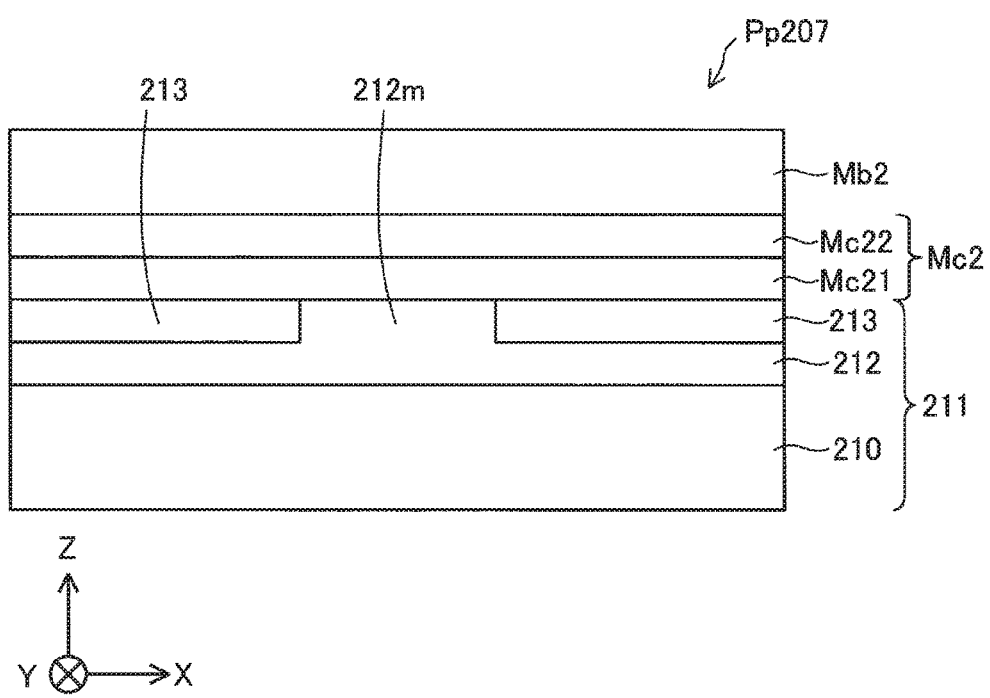
FIG. 23 is a diagram illustrating an intermediate product after process P207.

FIG. 23 is a diagram illustrating an intermediate product Pp207 after process P207. The p-type semiconductor regions 213 after activation of the p-type impurity are formed in the portions on the surface side of the n-type semiconductor layer 212 in the intermediate product Pp207. Since the main component (GaN) of the respective layers is not changed, the substrate 210 and the n-type semiconductor layer 212 with the p-type semiconductor regions 213 partly formed therein are also collectively called "GaN layer 211" in the description hereof.

In the heat treatment of process P207, the respective layers of the intermediate product Pp206 (shown in FIG. 22) are expected to be thermally expanded by different amounts corresponding to the respective coefficients of thermal expansion. The cap layer Mc2 receives the force in the extension direction from both the surface side and the rear face side. The cap layer Mc2, however, has neither the surface nor the rear face exposed in the atmosphere. There is accordingly little possibility that cracking occurs from the cap layer Mc2. There is also little possibility that cracking occurs in the block layer Mb2 which receives the force in the compression direction from the cap layer Mc2. Additionally there is little possibility that cracking occurs from the exposed rear face of the substrate 210 in the GaN layer 211 which also receives the force in the compression direction from the cap layer Mc2.

The coefficient of thermal expansion of the block layer Mb2 that is mainly composed of aluminum oxide ($Al_2O_3$) is larger than the coefficient of thermal expansion of the GaN layer 211. The thickness of the block layer Mb2 is, on the other hand, smaller than the thickness of the GaN layer 211. Accordingly the configuration of this embodiment provides a smaller difference between the magnitude of the force in the extension direction that the cap layer Mc2 receives from the surface and the magnitude of the force in the extension direction that the cap layer Mc2 receives from the rear face, compared with a configuration that the coefficient of thermal expansion of the block layer Mb2 is smaller than the coefficient of thermal expansion of the GaN layer 211. This configuration results in providing a smaller deviation of strain in the cap layer Mc2. From this point of view, there is little possibility that first cracking occurs in the cap layer Mc2.

After formation of the through film Mt21 (cap layer Mc21) at process P201, the cap layer Mc22 having the same main component is formed on the through film Mt21 (cap layer Mc21) at process P205. The heat treatment is subsequently performed at process P207. This configuration enables the magnesium atom (Mg) to be implanted into the n-type semiconductor layer 212 through the thin through film Mt21 (cap layer Mc21) at process P203 performed after process P201 and before process P205. At process P207 performed after process P205, on the other hand, the cap layer Mc2 having the sufficient thickness (the cap layer Mc21 and the cap layer Mc22) serves to absorb the force in the extension direction applied from both the surface and the rear face.

As described above, there is little possibility that cracking occurs from the surface (block layer Mb2), from the rear face (substrate 210), and from the intermediate layer (cap layer Mc2) in the intermediate product Pp206 during the heat treatment at process P207. Accordingly the intermediate product Pp206 is less likely to cause cracking as a whole during the heat treatment at process P207. As a result, for example, even when the substrate 210 is a substrate having the area of 1 inch or larger diameter, cracking is less likely to occur in the block layer Mb2 or in the cap layer Mc2 and is thereby less likely to damage the surface of the n-type semiconductor layer 212 and the p-type semiconductor regions 213p exposed in the atmosphere. The block layer Mb2 and the cap layer Mc2 accordingly serve to protect the whole surface of the GaN layer 211 and achieve a change to the p-type of the p-type semiconductor regions 213p arranged in the GaN layer 211

At process P208 in FIG. 16, the manufacturer removes the block layer Mb2. More specifically, the block layer Mb2 is removed by using an aqueous solution of hydrogen fluoride.

Figure 24:
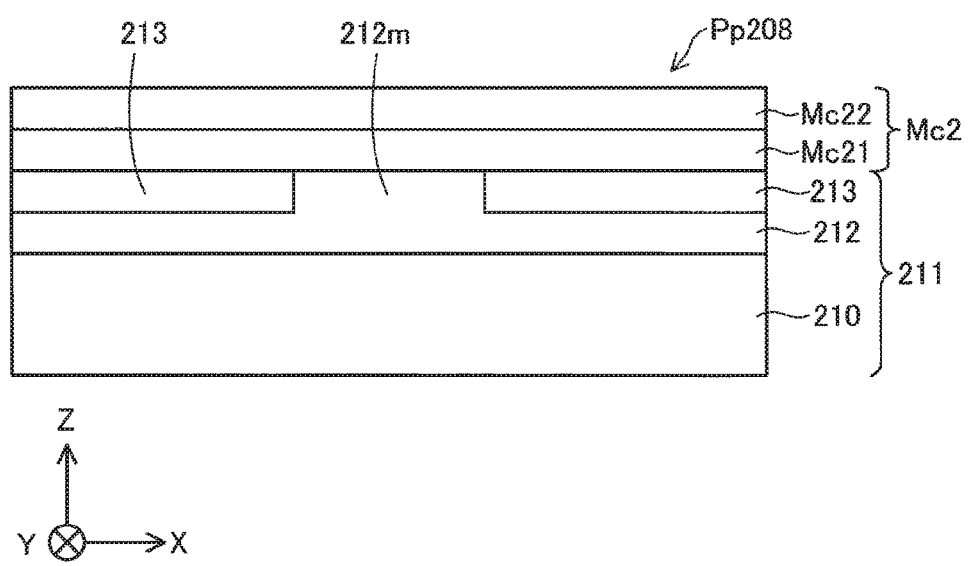
FIG. 24 is a diagram illustrating an intermediate product after process P208.

FIG. 24 is a diagram illustrating an intermediate product Pp208 after process P208. The block layer Mb2 is removed from above the cap layer Mc2 in the intermediate product Pp208.

At process P209 in FIG. 16, the manufacturer removes the cap layer Mc2. More specifically, the cap layer Mc2 is removed by wet etching using tetramethylammonium hydroxide (TMAH) of pH 12 at a predetermined temperature of not lower than 65° C. and not higher than 85° C. Both the cap layer Mc21 (through film Mt21) and the cap layer Mc22 constituting the cap layer Mc2 are removed at process P209.

Figure 25:
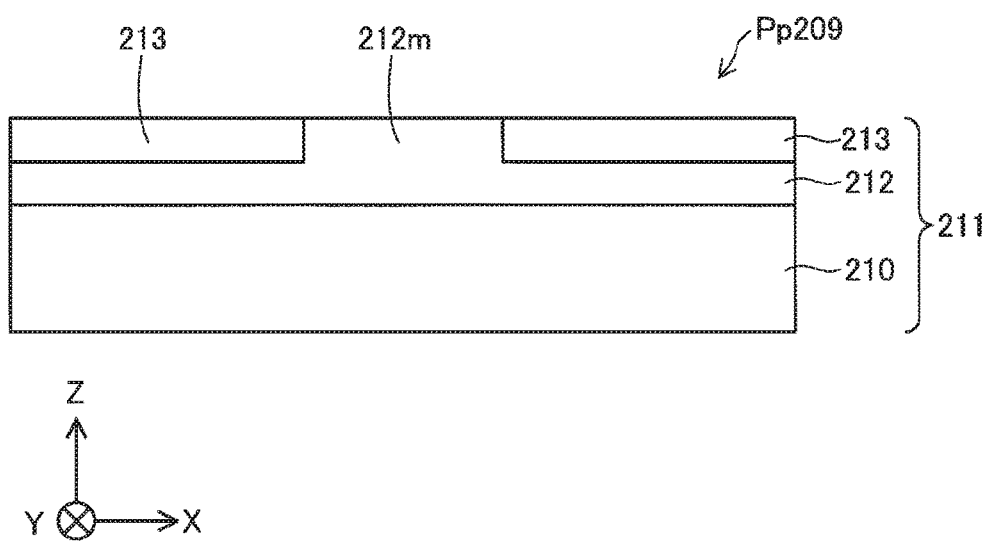
FIG. 25 is a diagram illustrating an intermediate product after process P209.

FIG. 25 is a diagram illustrating an intermediate product Pp209 after process P209. The cap layer Mc2 is removed from above the n-type semiconductor layer 212 and the p-type semiconductor regions 213 in the intermediate product Pp209.

At process P210 in FIG. 16, the manufacturer removes portions of the p-type semiconductor regions 213 or more specifically portions of non-adjacent parts of the p-type semiconductor regions 213 that are not adjacent to the protruded portion 212m of the n-type semiconductor layer 212, to form the mesa portion 222. The portions of the p-type semiconductor regions 213 are removed by dry etching.

Figure 26:
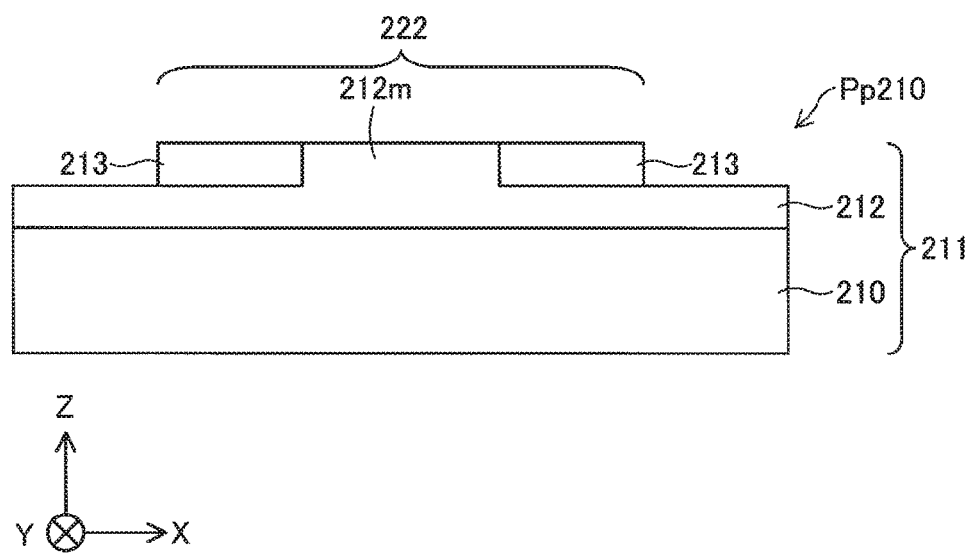
FIG. 26 is a diagram illustrating an intermediate product after process P210.

FIG. 26 is a diagram illustrating an intermediate product Pp210 after process P210. The mesa portion 222 protruded toward the positive (+)-side in the Z-axis direction is formed in the GaN layer 211 in the intermediate product Pp210.

At process P211 in FIG. 16, the manufacturer forms the anode electrode 251 and the cathode electrode 252 in the intermediate product Pp210 (shown in FIG. 26).

Figure 27:
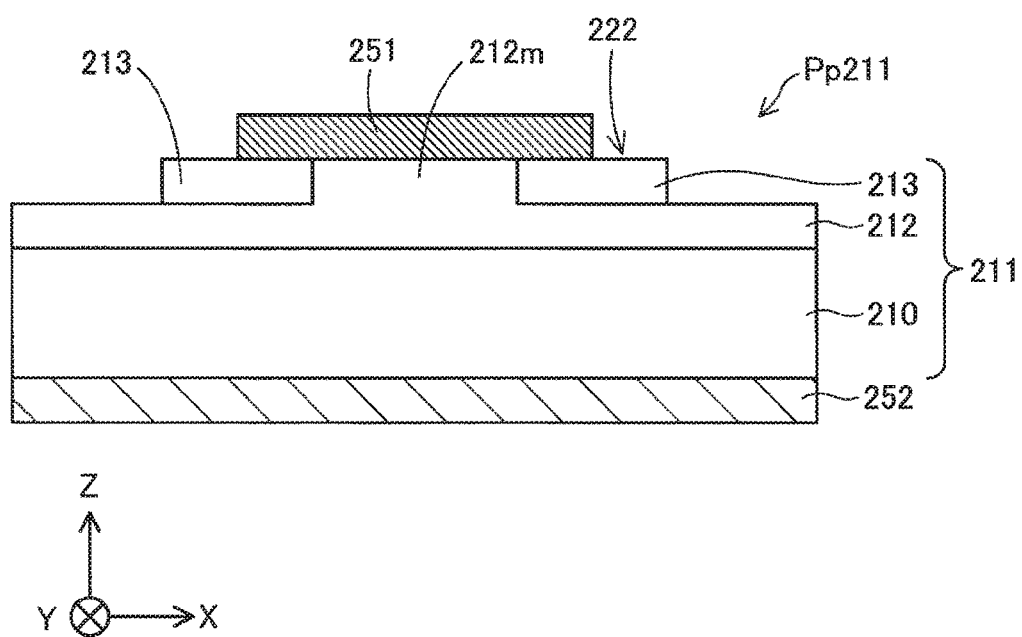
FIG. 27 is a diagram illustrating an intermediate product after process P211.

FIG. 27 is a diagram illustrating an intermediate product Pp211 after process P211. In the intermediate product Pp211, the anode electrode 251 is formed on the protruded portion 212m of the n-type semiconductor layer 212 and on respective adjacent parts, which are near to the protruded portion 212m, of the p-type semiconductor regions 213 formed on the respective sides of the protruded portion 212m. The cathode electrode 252 is formed on the rear face of the substrate 210.

At process P212 in FIG. 16, the manufacturer forms the insulating film 253. More specifically, the insulating film 253 is formed by atomic layer deposition (ALD).

Completion of process P212 completes the semiconductor device 200 shown in FIG. 15. In the semiconductor device 200, the insulating film 253 is continuously formed on the surface of the remaining portions of the n-type semiconductor layer 212 other than the mesa portion 222, on the remaining portions of the p-type semiconductor regions 213 without formation of the anode electrode 251 and on the portions of the anode electrode 251.

The GaN layer 211 according to this embodiment may be referred to as the "semiconductor layer". The cap layer Mcg may be referred to as the "cap layer". The cap layer Mc21 (through film Mt21) may be referred to as "at least part of the cap layer". The cap layer Mc22 may be referred to as "another part of the cap layer". The block layer Mb2 may be referred to as the "block layer".

Formation of the n-type semiconductor layer 212 at process P201 according to this embodiment may be referred to as the "growing the semiconductor layer". Formation of the through film Mt21 at process P201 may be referred to as the "forming at least part of the cap layer". Process P203 may be referred to as the "implanting the p-type impurity into the semiconductor layer by ion implantation". Process P205 may be referred to as the "forming another part of the cap layer". Process P206 may be referred to as the "forming the block layer on the cap layer". Process P207 may be referred to as the "heating the semiconductor layer such as to activate the p-type impurity".

C. Modifications

C1. Modification 1

(1) According to the first embodiment described above, at process P101, the substrate 110 is first provided, and the n-type semiconductor layer 112 is subsequently formed on the substrate 110. According to the second embodiment described above, at process P201, the substrate 210 is first provided, and the n-type semiconductor layer 212 is subsequently formed on the substrate 210. According to a modification, however, a substrate with an n-type semiconductor layer formed thereon in advance may be provided as the semiconductor layer. At least part of the cap layer that is mainly composed of a nitride may be formed after removal of an impurity such as Si and O from the surface of the semiconductor layer.

(2) According to the first embodiment described above, the n-type semiconductor layer 112 and the through film Mt11 (cap layer Mc11) are sequentially formed in this order on the substrate 110. According to the second embodiment described above, the n-type semiconductor layer 212 and the through film Mt21 (cap layer Mc21) are sequentially formed in this order on the substrate 210. According to a modification, however, growth of the semiconductor layer and formation of at least part of the cap layer may not be necessarily performed sequentially. For example, after growth of the semiconductor layer, the semiconductor layer may be moved to another process chamber. At least part of the cap layer may be subsequently formed after removal of an impurity such as Si and O from the surface of the semiconductor layer.

(3) According to the embodiments described above, the semiconductor layer 111 or 211 on which the through film Mt11 or Mt21 that is composed of a nitride and serves as a cap layer, is a layer mainly composed of gallium nitride (GaN). According to a modification, however, the semiconductor layer on which the cap layer is formed may be at least partly composed of another semiconductor containing a group III nitride, such as AlGaN.

(4) According to the first embodiment described above, the cap layer Mc11 (through film Mt11) of approximately 30 nm in thickness is formed. According to the second embodiment described above, the cap layer Mc21 (through film Mt21) of approximately 30 nm in thickness is formed. According to a modification, however, the thickness of the cap layer may be another value, for example, 5 nm or 200 nm. The thickness of the cap layer is preferably in a range of 1 nm to 50 nm.

The configuration that the thickness of the cap layer is not smaller than 1 nm reduces the possibility that a substance other than the target p-type impurity is implanted into the semiconductor layer by ion implantation, compared with a configuration that the thickness of the cap layer is smaller than 1 nm. The configuration that the thickness of the cap layer is not larger than 50 nm, on the other hand, enables the p-type impurity to pass through the cap layer and to be efficiently implanted into the semiconductor layer by ion implantation.

It is preferable that the thickness of the cap layer is not smaller than 1 nm, from the following point of view. The configuration that the thickness of the cap layer is not smaller than 1 nm facilitates confirmation of whether the cap layer remains on the semiconductor layer in the process of removing the cap layer, compared with the configuration that the thickness of the cap layer is smaller than 1 nm.

C2. Modification 2

According to the first embodiment described above, the mask for ion implantation M1 is made from the photoresist. According to the second embodiment described above, the mask for ion implantation M2 is also made from the photoresist. According to a modification, the mask for ion implantation used in the process of ion implantation into the n-type semiconductor layer may have another structure, for example, may be made from an insulating film, may be made from a metal film, or may have a layered structure of an insulating film and a metal film.

C3. Modification 3

(1) According to the first embodiment described above, the ion implantation (at P103 in FIG. 2) is performed at the predetermined temperature of not lower than 20° C. and not higher than 800° C. According to the second embodiment described above, the ion implantation (at P203 in FIG. 16) is also performed at the predetermined temperature of not lower than 20° C. and not higher than 800° C. According to a modification, however, the ion implantation may be performed at another temperature, for example, at 15° C. or at 950° C.

(2) According to the first embodiment described above, the average value of magnesium (Mg) concentration contained in the p-type semiconductor regions 113 is approximately $5 \times 10^{19}$ $cm^{-3}$. According to the second embodiment described above, the average value of magnesium (Mg) concentration contained in the p-type semiconductor regions 213 is also approximately $5 \times 10^{19}$ $cm^{-3}$. According to a modification, however, the average value of concentration of the acceptor element in the p-type semiconductor region formed in a portion of the n-type semiconductor layer may be another value, for example, approximately $1 \times 10^{17}$ $cm^{-3}$ or approximately $1 \times 10^{20}$ $cm^{-3}$. The average value of concentration of the acceptor element in the p-type semiconductor region formed in a portion of the n-type semiconductor layer is preferably not lower than $1 \times 10^{19}$ $cm^{-3}$.

(3) According to the first embodiment described above, the p-type impurity contained in the p-type semiconductor regions 113 is magnesium (Mg). According to the second embodiment described above, the p-type impurity contained in the p-type semiconductor regions 213 is also magnesium (Mg). According to a modification, however, the p-type impurity contained in the p-type semiconductor region may be another element, for example, beryllium (Be) or calcium (Ca). It is preferable that the p-type impurity contained in the p-type semiconductor region is at least one of magnesium (Mg) and beryllium (Be).

(4) According to the first embodiment described above, the depth of the p-type semiconductor region 113 is approximately 1.0 μm from the surface of the n-type semiconductor layer 112. According to the second embodiment described above, the p-type semiconductor region 213 occupies the range corresponding to the depth to the surface of the n-type semiconductor layer 212 other than the protruded portion 212m with respect to the Z-axis direction. According to a modification, however, the depth of the p-type semiconductor region formed in the n-type semiconductor layer may be another value, for example, approximately 0.1 μm or approximately 2.0 μm. The depth of the p-type semiconductor region formed in the n-type semiconductor layer is preferably in a range of 0.2 μm to 1.5 μm.

C4. Modification 4

(1) According to the first embodiment described above, the cap layer Mc12 is mainly composed of aluminum nitride (AlN). According to the second embodiment described above, the cap layer Mc22 is also mainly composed of aluminum nitride (AlN). According to a modification, however, the cap layer formed on the through film may be composed of another material including a group III nitride semiconductor, such as AlGaN. The cap layer may be composed of any material that serves to protect the semiconductor layer in heat treatment. The present disclosure is especially effective when the coefficient of thermal expansion of the cap layer is smaller than the coefficient of thermal expansion of the semiconductor layer.

(2) According to the first embodiment described above, the cap layer Mc12 is formed by metal organic chemical vapor deposition (MOCVD). According to the second embodiment described above, the cap layer Mc22 is also formed by metal organic chemical vapor deposition (MOCVD). According to a modification, however, the cap layer formed on the through film may be formed another technique such as sputtering.

(3) According to the first embodiment described above, the cap layer Mc12 of approximately 500 nm in thickness is formed. According to the second embodiment described above, the cap layer Mc22 of approximately 400 nm in thickness is formed. According to a modification, however, the thickness of the cap layer formed on the through film may be another value, for example, 0.5 nm or 1100 nm. The thickness of the cap layer formed on the through film is preferably in a range of 1 nm to 1000 nm.

(4) According to the first embodiment described above, the cap layer Mc12 is formed on the through film Mt11 (cap layer Mc11) (at P105 in FIG. 2, shown in FIG. 7). According to the second embodiment described above, the cap layer Mc22 is formed on the through film Mt21 (cap layer Mc21) (at P205 in FIG. 16, shown in FIG. 21). According to a modification, however, the cap layer may be formed by one process prior to the heat treatment (at P107 in FIG. 2 or at P207 in FIG. 16). For example, the cap layer may be formed prior to the ion implantation (at P103 in FIG. 2 or at P203 in FIG. 16), and no additional cap layer may be formed in a later process.

C5. Modification 5

(1) According to the first embodiment described above, the block layer Mb1 is mainly composed of aluminum oxide ($Al_2O_3$). According to the second embodiment described above, the block layer Mb2 is also mainly composed of aluminum oxide ($Al_2O_3$). According to a modification, however, the block layer may be composed of another material, for example, aluminum gallium nitride (AlGaN), gallium nitride (GaN) or zirconium dioxide ($ZrO_2$). The block layer may be composed of any material that serves to protect the semiconductor layer in heat treatment. It is preferable that the block layer includes at least one selected among the group consisting of aluminum gallium nitride (AlGaN), gallium nitride (GaN), aluminum oxide ($Al_2O_3$) and zirconium dioxide ($ZrO_2$).

(2) According to the first embodiment described above, the coefficient of thermal expansion of the block layer Mb1 is larger than the coefficient of thermal expansion of the GaN layer 111. According to a modification, however, the coefficient of thermal expansion of the block layer may be smaller than the coefficient of thermal expansion of the semiconductor layer.

(3) According to the first embodiment described above, the block layer Mb1 is formed by atomic layer deposition (ALD). According to the second embodiment described above, the block layer Mb2 is also formed by atomic layer deposition (ALD). According to a modification, however, the block layer may be formed by another technique such as sputtering.

(4) According to the first embodiment described above, the block layer Mb1 of approximately 500 nm in thickness is formed. According to the second embodiment described above, the block layer Mb2 of approximately 400 nm in thickness is formed. According to a modification, however, the thickness of the block layer may be another value, for example, 5 nm or 1100 nm. The thickness of the block layer is preferably in a range of 10 nm to 1000 nm.

C6. Modification 6

(1) According to the first embodiment and the second embodiment described above, the heat treatment is performed in the atmosphere gas containing nitrogen ($N_2$). According to a modification, however, the heat treatment may be performed in a gas mainly containing another material such as ammonia ($NH_3$) or hydrogen ($H_2$). It is preferable that the heat treatment is performed in a gas containing ammonia ($NH_3$) or nitrogen ($N_2$).

(2) According to the first embodiment described above, the heat treatment (at P107 in FIG. 2) is performed at 1250° C. According to the second embodiment described above, the heat treatment (at P207 in FIG. 16) is also performed at 1250° C. According to a modification, however, the heat treatment of the semiconductor layer may be performed at another temperature, for example, at 700° C. or at 1700° C. It is preferable that the heat treatment of the semiconductor layer is performed at a temperature of not lower than 800° C. and not higher than 1500° C.

According to the first embodiment described above, the heat treatment (at P107 in FIG. 2) is performed at 1250° C. for 30 minutes. According to the second embodiment described above, the heat treatment (at P207 in FIG. 16) is also performed at 1250° C. for 30 minutes. According to a modification, however, the heat treatment of the semiconductor layer may be performed for another time period, for example, 30 seconds or 45 minutes, according to the target temperature. It is preferable that the heat treatment of the semiconductor layer is performed for a time period of not shorter than 1 minute and not longer than 60 minutes.

(3) According to the first embodiment described above, the heat treatment (at P107 in FIG. 2) is performed under a pressurized environment. According to the second embodiment described above, the heat treatment (at P207 in FIG. 16) is also performed under a pressurized environment. According to a modification, however, the heat treatment may be performed under an atmospheric pressure environment or under a reduced pressure environment.

C7. Modification 7

According to the first embodiment described above, the block layer Mb1 is removed by using an aqueous solution of hydrogen fluoride. According to the second embodiment described above, the block layer Mb2 is also removed by using an aqueous solution of hydrogen fluoride. According to a modification, the block layer formed from a photoresist may be removed by using another aqueous solution, for example, a mixed aqueous solution of ammonium hydrogen fluoride and ammonium fluoride. It is preferable that the block layer formed from a photoresist is removed by using an aqueous solution of hydrogen fluoride or by using a mixed aqueous solution of ammonium hydrogen fluoride and ammonium fluoride. The block layer configured to include a metal may be removed by using hydrochloric acid, nitric acid or aqua regia.

According to another modification, the block layer may be removed by dry etching.

C8. Modification 8

According to the first embodiment described above, the cap layer Mc1 is removed by wet etching using tetramethylammonium hydroxide (TMAH) of pH 12. According to the second embodiment described above, the cap layer Mcg is also removed by wet etching using tetramethylammonium hydroxide (TMAH) of pH 12. According to a modification, the cap layer may be removed by another technique such as dry etching.

C9. Other Modifications

The disclosure is not limited to any of the embodiments, the examples, and the modifications described above but may be implemented by a diversity of other configurations without departing from the scope of the disclosure. For example, the technical features of any of the embodiments, the examples and the modifications may be replaced or combined appropriately, in order to solve part or all of the problems described above or in order to achieve part or all of the advantageous effects described above. Any of the technical features may be omitted appropriately unless the technical feature is described as essential herein. The present disclosure may be implemented by aspects described below.

(1) According to one aspect of the disclosure, there is provided a manufacturing method of a semiconductor device. The manufacturing method of a semiconductor device comprises: forming, as a through film, at least part of a cap layer that is mainly composed of a nitride, on a semiconductor layer that is mainly composed of a group III nitride semiconductor; implanting a p-type impurity into the semiconductor layer with at least part of the cap layer formed thereon, by ion implantation; forming a block layer having a larger coefficient of thermal expansion than a coefficient of thermal expansion of the cap layer, as a surface layer on the cap layer; and heating the semiconductor layer with the block layer as the surface layer, activate the p-type impurity.

The semiconductor layer that is mainly composed of a group III nitride semiconductor has a larger coefficient of thermal expansion than the coefficient of thermal expansion of the cap layer that is mainly composed of a nitride. In the heating process to activate the p-type impurity, the cap layer receives a force of extending the cap layer in a direction perpendicular to a stacking direction, from the semiconductor layer. The block layer is, however, formed on the cap layer. The coefficient of thermal expansion of the block layer is larger than the coefficient of thermal expansion of the cap layer. As a result, the block layer serving as the surface layer receives a force of compressing the block layer in the direction perpendicular to the stacking direction, from the cap layer in the heating process. This configuration reduces the likelihood that cracking occurs from the surface of the surface layer in the heating process, compared with a configuration that the surface layer receives a force of extending the surface layer from an adjacent layer. Cracking that passes through the respective layers in the heating process is more likely to occur from the exposed surface of the surface layer and to be extended. In the configuration of this aspect, cracking is thus less likely to occur and pass through the respective layers provided on the semiconductor layer that is mainly composed of a group III nitride semiconductor, in the heating process.

The manufacturing method of the semiconductor device of this aspect may further comprise removing the cap layer and the block layer; forming an electrode layer on the semiconductor layer; and forming an insulating layer on the semiconductor layer.

(2) In the manufacturing method of the semiconductor device of the above aspect, in the implanting the p-type impurity into the semiconductor layer by ion implantation, a through film that is at least part of the cap layer may have a thickness of 1.0 nm to 50 nm. The configuration that the thickness of the cap layer serving as a through film in ion implantation is not smaller than 1.0 nm reduces the possibility that a substance other than the target p-type impurity is implanted into the semiconductor layer by ion implantation, compared with a configuration that the thickness of the through film is smaller than 1.0 nm. The configuration that the thickness of the cap layer serving as a through film in ion implantation is not larger than 50 nm, on the other hand, enables the p-type impurity to be efficiently implanted into the semiconductor layer by ion implantation.

(3) In the manufacturing method of the semiconductor device of the above aspect, in the forming the block layer, the block layer may have a thickness that is smaller than a thickness of the semiconductor layer, and the coefficient of thermal expansion that is larger than a coefficient of thermal expansion of the semiconductor layer. This configuration provides a smaller difference between the tensile forces in the extension direction that the cap layer receives from the block layer and from the semiconductor layer on the respective sides of the cap layer, compared with a configuration that the thickness of the block layer is smaller than the thickness of the semiconductor layer and that the coefficient of thermal expansion of the block layer is smaller than the coefficient of thermal expansion of the semiconductor layer. This configuration results in providing a smaller deviation in distribution of the stress applied to the cap layer and thereby reduces the possibility that cracking occurs in the cap layer.

(4) In the manufacturing method of the semiconductor device of the above aspect, the heating the semiconductor layer may be performed under a pressurized environment. This configuration reduces the likelihood of release of nitrogen from the semiconductor layer during the heat treatment, compared with a configuration that the heat treatment of the semiconductor layer is performed under an unpressurized environment.

In the manufacturing method of the semiconductor device of the above aspect, the forming at least part of the cap layer may comprise forming a through film that is part of the cap layer. The manufacturing method of the semiconductor device of this aspect may further comprise forming another part of the cap layer that is mainly composed of a nitride, on the through film that is the part of the cap layer, after the implanting the p-type impurity into the semiconductor layer by ion implantation and before the heating the semiconductor layer. This configuration provides the cap layer having such a thickness as to sufficiently absorb a difference between the amount of thermal expansion of the block layer and the amount of thermal expansion of the semiconductor layer during the heat treatment of the semiconductor layer. This configuration also provides the cap layer having such a thickness (thinness) as to allow for sufficient transmission of the p-type impurity through the cap layer in ion implantation.

(5) The manufacturing method of the semiconductor device of the above aspect may further comprises: growing the semiconductor layer, prior to the forming at least part of the cap layer. The forming at least part of the cap layer may be performed immediately subsequent to the growing the semiconductor layer. This configuration enables at least part of the cap layer to be formed immediately subsequent to formation of the semiconductor layer without the presence of O and Si on the surface of the semiconductor layer. O and Si are accordingly not present between the semiconductor layer and the cap layer. This configuration thus prevents O and Si from being implanted together with the target p-type impurity into the semiconductor layer by ion implantation.

(6) In the manufacturing method of the semiconductor device of the above aspect, the block layer may include at least one selected among the group consisting of aluminum gallium nitride (AlGaN), gallium nitride (GaN), aluminum oxide ($Al_2O_3$) and zirconium dioxide ($ZrO_2$).

(7) In the manufacturing method of the semiconductor device of the above aspect, the p-type impurity may be at least one of magnesium (Mg) and beryllium (Be).

(8) In the manufacturing method of the semiconductor device of the above aspect, the implanting the p-type impurity by ion implantation may be performed at a temperature of 20° C. to 800° C.

(9) In the manufacturing method of the semiconductor device of the above aspect, an atmosphere gas in the heating the semiconductor layer may include at least one selected among the group consisting of ammonia ($NH_3$), nitrogen ($N_2$) and hydrogen ($H_2$).

(10) In the manufacturing method of the semiconductor device of the above aspect, the heating the semiconductor layer may be performed at a temperature of 800° C. to 1500° C.

(11) In the manufacturing method of the semiconductor device of the above aspect, the heating the semiconductor layer may be performed at a temperature of 800° C. to 1500° C. for a time period of 1 minute to 60 minutes.

All the plurality of components included in each of the aspects of the disclosure described above are not essential, but some components among the plurality of components may be appropriately changed, omitted or replaced with other additional components or part of the limitations may be deleted, in order to solve part or all of the problems described above or in order to achieve part or all of the advantageous effects described herein. In order to solve part or all of the problems described above or in order to achieve part or all of the advantageous effects described herein, part or all of the technical features included in one aspect of the disclosure described above may be combined with part or all of the technical features included in another aspect of the disclosure described above to provide one independent aspect of the disclosure.

The disclosure may be implemented by any of various aspects other than the manufacturing method of the semiconductor device described above, for example, a manufacturing method of an electric equipment including the semiconductor device of any of the above aspects incorporated therein, a manufacturing apparatus for manufacturing the semiconductor device or the electric equipment or a method of designing the semiconductor device or the electric equipment.

What is claimed is:

1. A manufacturing method of a semiconductor device, comprising:
    forming at least part of a cap layer that is mainly composed of a nitride, on a semiconductor layer that is mainly composed of a group III nitride semiconductor;
    implanting a p-type impurity into the semiconductor layer with at least part of the cap layer formed thereon, by ion implantation;
    forming a block layer having a larger coefficient of thermal expansion than a coefficient of thermal expansion of the cap layer, as a surface layer on the cap layer; and
    heating the semiconductor layer with the block layer as the surface layer, activate the p-type impurity.

2. The manufacturing method of the semiconductor device according to claim 1,
    wherein in the implanting the p-type impurity into the semiconductor layer by ion implantation, at least part of the cap layer has a thickness of 1.0 nm to 50 nm.

3. The manufacturing method of the semiconductor device according to claim 1,
    wherein in the forming the block layer, the block layer has a thickness that is smaller than a thickness of the semiconductor layer, and the coefficient of thermal expansion that is larger than a coefficient of thermal expansion of the semiconductor layer.

4. The manufacturing method of the semiconductor device according to claim 1,
    wherein the heating the semiconductor layer is performed under a pressurized environment.

5. The manufacturing method of the semiconductor device according to claim 1, further comprising:
    growing the semiconductor layer, prior to the forming at least part of the cap layer, wherein
    the forming at least part of the cap layer is performed immediately subsequent to the growing the semiconductor layer.

6. The manufacturing method of the semiconductor device according to claim 1,
    wherein the block layer includes at least one selected among the group consisting of aluminum gallium nitride (AlGaN), gallium nitride (GaN), aluminum oxide ($Al_2O_3$) and zirconium dioxide ($ZrO_2$).

7. The manufacturing method of the semiconductor device according to claim 1,
    wherein the p-type impurity is at least one of magnesium (Mg) and beryllium (Be).

8. The manufacturing method of the semiconductor device according to claim 1,
    wherein the implanting the p-type impurity by ion implantation is performed at a temperature of 20° C. to 800° C.

9. The manufacturing method of the semiconductor device according to claim 1,
    wherein an atmosphere gas in the heating the semiconductor layer includes at least one selected among the group consisting of ammonia ($NH_3$), nitrogen ($N_2$) and hydrogen ($H_2$).

10. The manufacturing method of the semiconductor device according to claim 1,
    wherein the heating the semiconductor layer is performed at a temperature of 800° C. to 1500° C.

11. The manufacturing method of the semiconductor device according to claim 10,
    wherein the heating the semiconductor layer is performed at a temperature of 800° C. to 1500° C. for a time period of 1 minute to 60 minutes.

* * * * *